United States Patent [19]
Ogawa et al.

[11] 4,451,753
[45] May 29, 1984

[54] PIEZOELECTRIC DEVICE WITH SURFACE CHARGE SHUNT

[76] Inventors: Toshio Ogawa, 8-89, Ooharanonishisakaidani-cho 3-chome, Nishikyo-ku, Kyoto-shi, Kyoto-fu; Kikuo Wakino, 100-78, Mozume-cho, Kitanoguchi, Muko-shi, Kyoto-fu, both of Japan

[21] Appl. No.: 169,219

[22] Filed: Jul. 15, 1980

[30] Foreign Application Priority Data

Sep. 13, 1979 [JP] Japan .................. 54-118563
Oct. 2, 1979 [JP] Japan .................. 54-137067
Apr. 14, 1980 [JP] Japan .................. 55-49492
May 14, 1980 [JP] Japan .................. 55-64226

[51] Int. Cl.³ ............................. H04R 17/00
[52] U.S. Cl. ......................... 310/315; 310/317; 310/346; 331/176
[58] Field of Search .......... 310/315, 334, 346, 363, 310/364, 366, 313 R, 313 A-313 D; 333/155; 357/26, 28; 331/107 A, 116 R, 116 FE, 158, 176

[56] References Cited
U.S. PATENT DOCUMENTS
3,397,329 8/1968 Riedel .................. 310/315
3,818,254 6/1974 Persson ................ 310/315

Primary Examiner—J. D. Miller
Assistant Examiner—D. L. Rebsch

[57] ABSTRACT

A bulk wave piezoelectric device comprises a polarized ferroelectric ceramic plate, and electrodes formed on two main surfaces thereof, respectively, intersecting the polarization axis direction. The electrodes are connected to each other by means of an external resistance having a predetermined resistance value. The resistance value is selected to be smaller than the inherent resistance value of the ferroelectric ceramic plate between the two main surfaces. Positive and negative electric charges are stored on the two electrodes due to the pyroelectric effect responsive to a change of the temperature of the ferroelectric ceramic plate. The potential difference caused by the electric charges thus stored is rapidly decreased through the external resistance.

13 Claims, 56 Drawing Figures

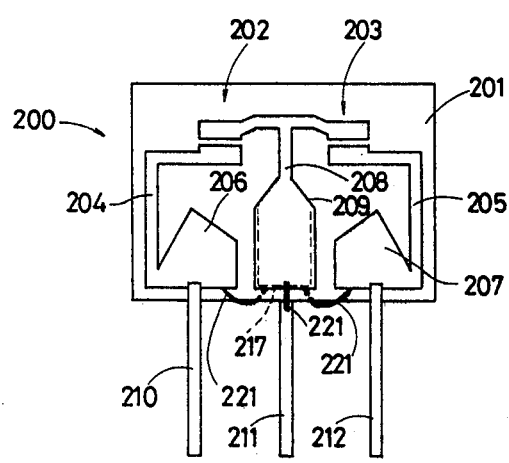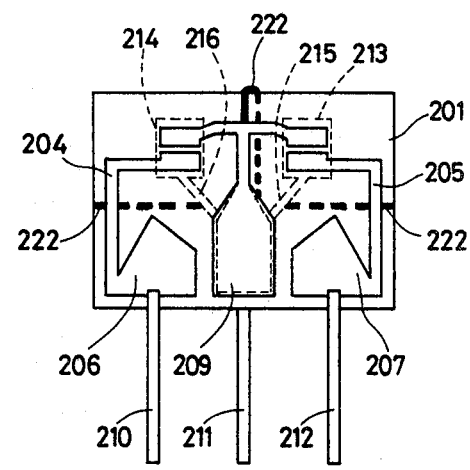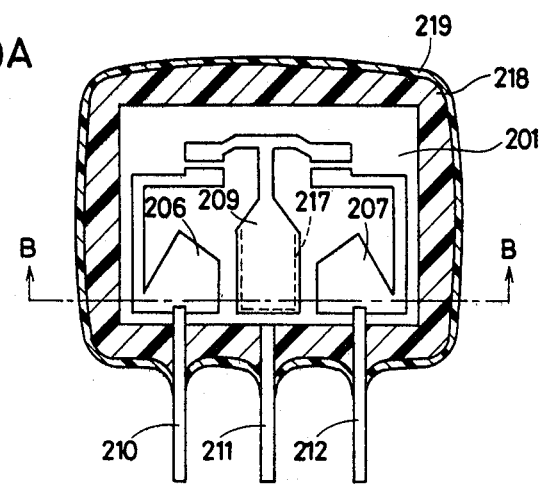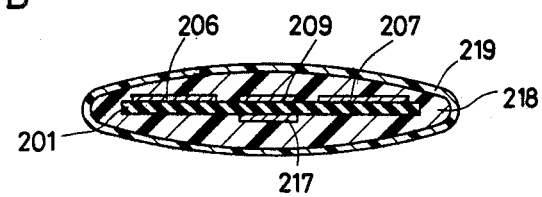

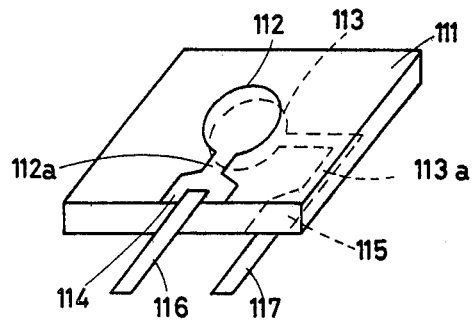
FIG. 23
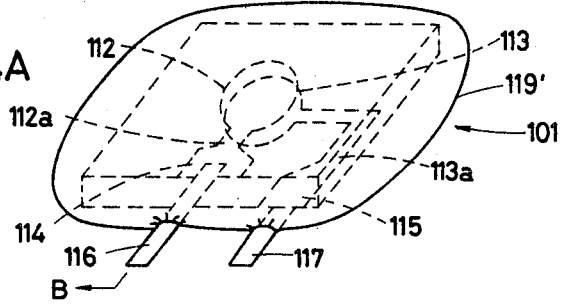
FIG. 24A
FIG. 24B
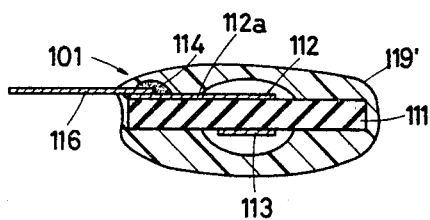
FIG. 25
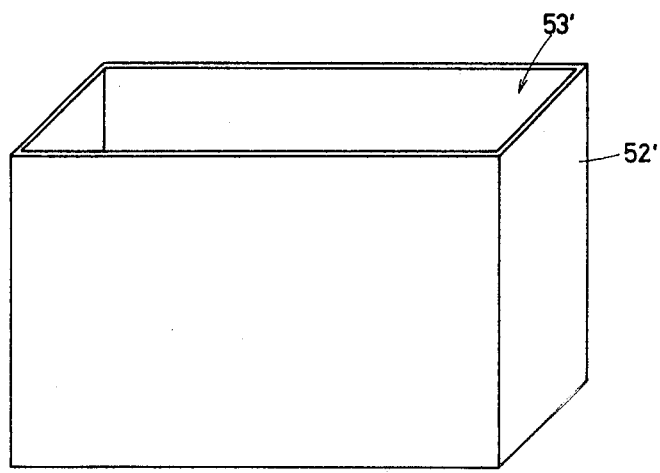

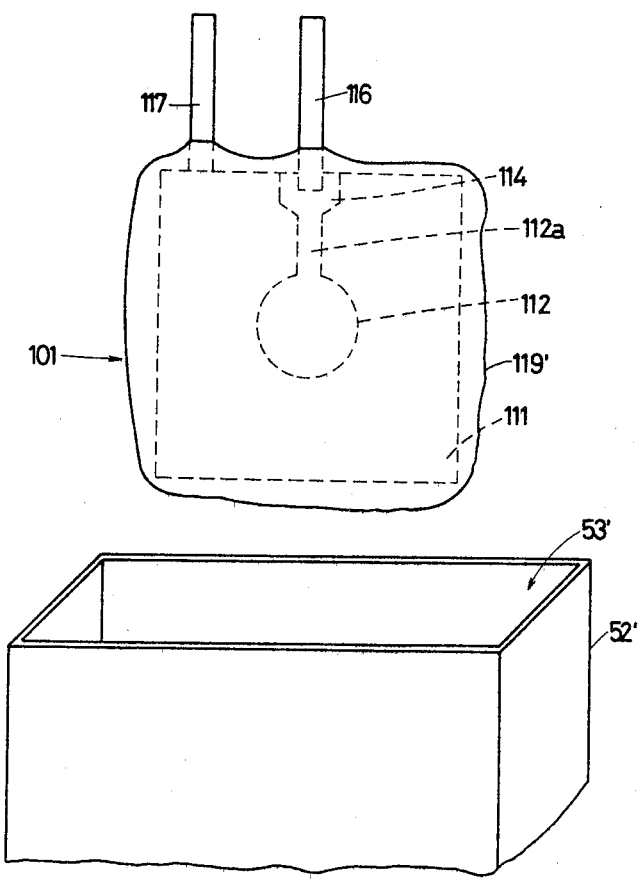
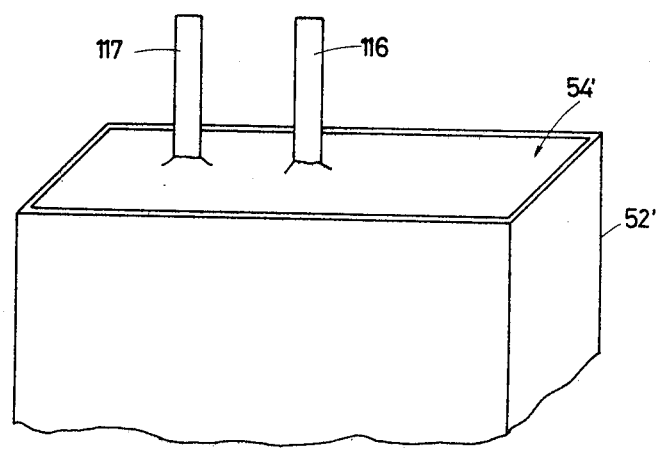

PIEZOELECTRIC DEVICE WITH SURFACE CHARGE SHUNT

BACKGROUND OF THE INVENTION

1. Field of the Invention

The present invention relates to a bulk wave piezoelectric device. More specifically, the present invention relates to a bulk wave piezoelectric device utilizing a characteristic of a polarized piezoelectric member such as a surface acoustic wave device, a bulk wave piezoelectric resonator device, a piezoelectric transducer, a mechanical resonator device, including a piezoelectric transducer and an electroacoustic transducer, and the like.

This invention is an improvement upon the invention of U.S. application Ser. No. 169,165, filed the same date, entitled "Piezoelectric Device", and commonly owned.

2. Description of the Prior Art

A bulk wave piezoelectric resonator device is made of a ceramic material having a piezoelectric effect. A typical material comprises a ceramic of a barium titanate group, the lead titanate group, the lead titanate zirconate group or the like. Of late, a bulk wave piezoelectric resonator device has been used in various kinds of filters, traps, discriminators, oscillators and the like. The piezoelectric device further comprises a piezoelectric transducer, which is employed for example in mechanical resonator devices and in electroacoustic transducers. A piezoelectric transducer also employs, as a typical material, a ceramic of the barium titanate group, the lead titanate group, the lead titanate zirconate group and the like. Piezoelectric tuning forks and electromechanical filters are known as typical examples of mechanical resonators using a piezoelectric transducer and are used as selecting devices or used as oscillators in receivers, remote control systems, pocket bells and the like. Electroacoustic transducers employing a piezoelectric ceramic transducer are typically used in microphones, pickups, cartridges, speakers, buzzers, sonar, ultrasonic cleaners, ultrasonic machinery, remote control apparatus and the like, depending upon classifications in terms of applications and the frequency being used ranges from several Hz to several hundred kHz, with diversification of a vibration wave format from a very low frequency vibration to an audible sound and ultrasonic wave.

A device of high reliability is required in such types having piezoelectric devices and particularly a device of a characteristic that is stable with respect to the environment, particularly environmental temperature and elevated temperatures.

However, in a conventional device, a phenomenon often occurs in which the piezoelectric characteristic is degraded when the device is placed in a severe temperature environment or an elevated temperature environment, which is observed by means of special tests such as a heat shock test or a high temperature test. Therefore, conventionally various kinds of improvements have been proposed; however, a fully satisfactory approach has not yet been found.

Generally, a ferroelectric plate used in a piezoelectric device must meet the following requirements as important characteristics: (1) in the case of a filter, for example, the insertion loss, the center frequency and the like must not change with temperature variation, and (2) in the case of a transducer, for example, the electromechanical coupling coefficient must be large, and so on. For example, it has been proposed that various kinds of additives be added to the main constituent of the ceramic, which may typically be a ceramic of the lead titanate zirconate group, for example, in an attempt to improve the characteristic by selection of the materials themselves. In fact an improvement can be seen to some extent in the heat shock test and the high temperature aging test by thus changing the materials and the above described characteristic (1) might be satisfactorily obtained in this way; nonetheless, it has been observed that the above described characteristic (2) is still degraded in this case.

Furthermore, attempts have been made to improve the above described characteristic (1) by appropriate selection of the firing conditions; however, the disadvantage results that the above described characteristic (2) varies widely from one article to another or is degraded, while control of such firing conditions is difficult and the approach is not suited for production on an industrial basis.

SUMMARY OF THE INVENTION

A piezoelectric device in accordance with the present invention comprises a polarized ferroelectric plate, and two members formed on and in electrical contact with the surfaces thereof intersecting the polarization axis direction of the ferroelectric plate. A kind of electric charge is caused and stored on the two members due to a change of the temperature of the ferroelectric plate, whereby a potential difference is generated. According to the present invention, potential difference decreasing means is provided in electrical contact with at least one of the two members for the purpose of decreasing the above described potential difference.

According to the present invention, the counterelectric field developed across the ferroelectric plate due to the electric charges caused by the pyroelectric effect is rapidly decreased. Therefore, degradation of the piezoelectric characteristic for example by depolarization of the polarized ferroelectric plate responsive to a change of the temperature of the ferroelectric plate, is prevented. More specifically, according to the present invention, the electric charges generated on the ferroelectric plate due to a change of the temperature thereof are discharged through an external electric circuit. Accordingly, it is not necessary with the inventive piezoelectric device to change the composition of the material of the ferroelectric plate for the purpose of eliminating the above described piezoelectric characteristic and as a result a piezoelectric device having a piezoelectric characteristic that is stable with respect to a change of the temperature is provided simply and without adversely affecting the other piezoelectric characteristics. Therefore, in manufacturing piezoelectric devices on an industrial basis, productivity and yield rate can be enhanced. Furthermore, since the inventive piezoelectric device has a stable characteristic in a changing temperature environment or and a high temperature environment, a piezoelectric device of extremely high reliability is provided.

In a preferred embodiment of the present invention, the piezoelectric device comprises a bulk wave device comprising a first electrode formed on the ferroelectric plate. A ground electrode or other member is electrically connected to the other surface of the ferroelectric plate. The first electrode and the ground electrode or other member are electrically connected through a conductive element having a predetermined resistance value. Such conductive element may comprise a resistive paste, a resistive resin material or the like. Therefore, according to the preferred embodiment of the present invention under discussion, a bulk wave device exhibiting a stabilized characteristic, i.e., showing little change or shift of the center frequency, the insertion loss and the like, in a changing temperature environment or a high temperature environment can be provided in accordance with a simple scheme. By employing a resistive paste as the resistive component, the resistive component can be formed in accordance with a simple method such as baking, coating or the like. Therefore, productivity and the yield rate are drastically improved. By forming the resistive component with a resistive resin material, a resin outer coating of the surface acoustic wave device may be formed with a resistive resin layer and as a result no particular step is required in addition to providing a conventional resin outer coating of the surface acoustic wave device. Furthermore, in employing a conventional resin coating, a resin coated surface acoustic wave element may be housed within a metallic casing, which may be filled with a filling or potting meterial made of a resistive resin material, may be filled therebetween, without necessity of any special extra step.

In another preferred embodiment of the present invention, the first electrode and the ground electrode of the bulk wave device are connected to the ground potential. The first electrode is connected to the ground through a resistive component having a predetermined resistance value. Even by connecting to the ground potential the two electrodes where the electric charges due to a change of the temperature are stored, the above described counterelectric field can be rapidly decreased and depolarization of the ferroelectric plate can be effectively prevented. Even in accordance with the preferred embodiment under discussion, the manufacturing process and the structure are extremely simple. In particular, the embodiment is advantageous when the surface acoustic wave device is structured as a hermetic seal type.

In a further preferred embodiment of the present invention, the piezoelectric device comprises a pair of vibrating electrodes formed on the ferroelectric plate. The pair of vibrating electrodes are electrically connected through a resistive component, by which term is always meant herein a conductive element having a predetermined resistance value. Such resistive component may comprise a resistive paste, a conductive resin material or the like. According to the further preferred embodiment in discussion, a piezoelectric device having a stabilized characteristic, i.e., little change of characteristic in a changing temperature environment or a high temperature environment, can be provided in accordance with a simple structure and method. By employing a conductive paste as the resistive component, the resistive component can be formed in accordance with a simple method such as baking, coating or the like. Therefore, productivity and the yield rate are drastically improved. By forming the conductive component with a resistive resin material, a resin outer coating of the piezoelectric device may be formed as a conductive resin layer and no extra step is required in addition to a conventional resin outer coating for the piezoelectric device. In employing a conventional resin material, a resonator element is housed in a metallic casing and a filling or potting material of a resistive resin material may be filled therebetween, without necessity of any particular step.

In still a further preferred embodiment of the present invention, each of the pair of vibrating electrodes of the piezoelectric device is connected through a resistive component having a predetermined resistance value. Even by connecting to the ground potential these two vibrating electrodes in which the electric charges are stored due to a change of the temperature, the above described counterelectric field can be rapidly decreased and depolarization of the ferroelectric plate can be effectively prevented. Even according to the further preferred embodiment under discussion, the manufacturing process and the structure may be extremely simple.

Accordingly, a principal object of the present invention is to provide an improved piezoelectric device.

Another object of the present invention is to provide a piezoelectric device which solves a problem of materials by means of an external circuit.

A further object of the present invention is to provide a piezoelectric device having a stabilized characteristic with respect to a severe environment of high or changing temperatures.

Still a further object of the present invention is to provide a stabilized piezoelectric device in accordance with a simple manufacturing method and structure.

It is another object of the present invention to provide a piezoelectric device exhibiting no degradation of the characteristic in a severe environment of high or changing temperatures in accordance with a simple manufacturing process.

It is a further object of the present invention to provide an improved piezoelectric device of a good mass productivity.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 39B is a sectional view taken along the line B—B in FIG. 39A;

FIGS. 7 to 10A&B are views showing different embodiments of a piezoelectric ceramic filter in accordance with one embodiment of the present invention; in particular, FIG. 44B is a sectional view taken along the line B—B in FIG. 44A;

FIGS. 23 to 27 are views showing in succession the steps of a process for manufacturing one example of an energy trapped piezoelectric ceramic resonator in accordance with one embodiment of the present invention;

FIGS. 28 and 29 are views showing one Example of a conventional piezoelectric tuning fork wherein the present invention can be employed, wherein FIG. 28 is an outline plan view with the casing removed and FIG. 29 is an outline front view with the casing removed;

DESCRIPTION OF THE PREFERRED EMBODIMENTS

The present invention can be applied to any types of piezoelectric devices employing a polarized piezoelectric member, polarized, such as a surface acoustic wave device, a bulk wave piezoelectric resonator device, a piezoelectric transducer, a mechanical resonator device including a piezoelectric transducer, and electroacoustic transformer, and the like. In the following, therefore, various embodiments and modifications will be described in detail.

Figure 1:
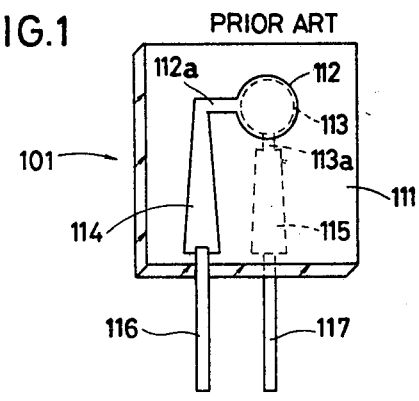
FIG. 1 is a view showing one example of a conventional energy trapped piezoelectric ceramic resonator wherein the present invention can be employed.

Now a bulk wave piezoelectric resonator embodying the present invention will be described. FIG. 1 is a view showing one example of a conventional piezoelectric resonator employing an energy trapped thickness longitudinal vibration mode in accordance with the present invention. Such a piezoelectric resonator itself is well-known to those skilled in the art and therefore only an improvement in association with the present invention will be described. The piezoelectric resonator 101 comprises a piezoelectric plate 111 of a square of 5 mm by 5 mm and 0.2 mm thick. The piezoelectric plate 111 is made of ferroelectric ceramic of the lead titanate zirconate group, for example, and is polarized in the thickness direction. The vibrating electrodes 112 and 113 of 1 mm in diameter are formed on the piezoelectric ceramic plate 111 so as to be facing each other to excite the plate 101 on that portion. The vibrating electrode 112 is electrically connected to the withdrawing electrode 114 by the lead electrode 112a. The vibrating electrode 113 on the rear surface of the plate is electrically connected to the withdrawing electrode 115 by means of the lead electrode 113a. These withdrawing electrodes 114 and 115 are connected to the input and output terminals, i.e. the withdrawing terminals 116 and 117, respectively, by soldering, for example. The composite thus obtained is subjected to a coating process using an insulating resin material, not shown, in accordance with a method as disclosed in Japanese Patent Publication No. 22384/1970, whereby a piezoelectric resonator having the resonance frequency of 10.7 MHz is completed.

FIGS. 2, 3, 4, 5A, and 5B are views showing further embodiments of the present invention. The size of the piezoelectric plate 111 and the size of the vibrating electrode 112 and so on are the same. In these embodiments, as the composition of the piezoelectric plate 111, a ceramic of a lead titanate zirconate group of such as $(Pb_{0.95}Sr_{0.05})(Ti_{0.48}Zr_{0.52})O_3 + 0.75$ wt% $Nb_2O_5 + 0.15$ wt% $Cr_2O_3$ was employed. When such a ceramic is used, the resistance value between the withdrawing terminals 116 and 117 in a conventional structure is $5 \times 10^{12} \Omega$.

Figure 2:
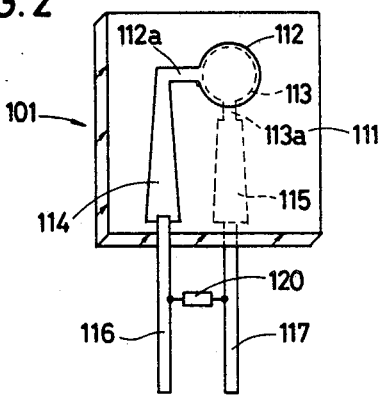
FIGS. 2 to 5A&B are views showing different embodiments of an energy trapped piezoelectric ceramic resonator in accordance with one embodiment of the present invention; in particular.

In the FIG. 2 embodiment, a discrete resistor 120 is connected between the withdrawing terminals 116 and 117. The resistance value of the resistor 120 may be $1K\Omega$ $100k\Omega$, $10M\Omega$ or $1000M\Omega$; however, in the embodiment shown a resistor of $100k\Omega$ is actually used. The resistor 120 may be connected in any place suitable place for the purpose of the present invention, such as between the withdrawing electrodes 114 and 115, between the lead electrodes 112a and 113a or the like. In the FIG. 3 embodiment, the resistive paste 121 is formed over both surfaces of the piezoelectric ceramic plate 111 and is baked, whereby a given resistance value is established between the withdrawing electrodes 114 and 115. As the resistive paste 121, one having carbon powder dispersed in phenol resin is employed and the resistance value is selected to be $1k\Omega$, $100K\Omega$, $10M\Omega$ and the like, however, in the actual experiment performed the resistive paste 121 of $1k\Omega$ and $10M\Omega$ was baked. The resistive paste 121 is formed at the position as shown by reference character 122, whereby the withdrawing electrodes 114 and 115 are conected. In other words, the connection position may be arbitrarily determined provided it is suited to the purpose of the present invention.

In the previously described embodiments shown in FIGS. 2 and 3 and the embodiments to be described with reference to FIGS. 5A and 5B, the vibrating electrodes 112 and 113, the lead electrodes 112a and 113a and the withdrawing electrodes 114 and 115 are formed as silver electrodes by means of an evaporation process or a sputtering process so that the resistance value thereof may be approximately zero, whereas in the FIG. 4 embodiment these electrodes are formed as a resistive metal (such as tantalum, titanium or the like) by means of an evaporation process or a sputtering process, or a resistive metal oxide (such as tin oxide). In the latter mentioned embodiment, a silver paste 122 of the resistance value of approximately zero is formed on both surfaces of the piezoelectric ceramic plate 111 and is baked, whereby the withdrawing electrodes 114 and 115 are directly connected rather than through a resistor. As a matter of course, a short-circuiting lead wire, not shown, may be used in place of the silver paste 122 and such connection position may be arbitrarily determined, insofar as it is suited to the purpose of the present invention. Furthermore, the silver paste 122 or the short-circuiting lead wire may be of a resistive component. The resultant resistance value of these vibration electrodes 112 and 113, the lead electrodes 112a and 113a, or the withdrawing electrodes 114 and 115, and the silver paste 122 or the short-circuiting lead wire must be selected to be smaller than the resistance value of the piezoelectric ceramic plate 111 per se.

Figure 5A:
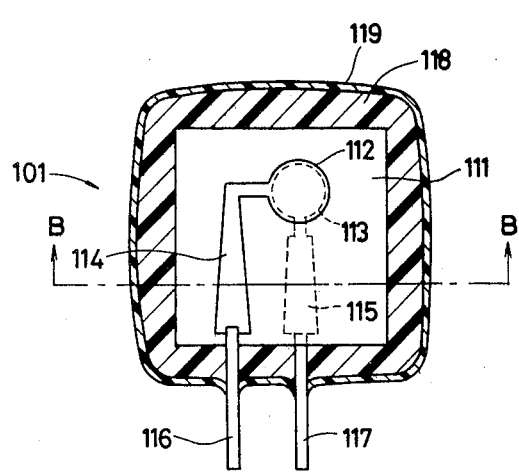
Figure 5B:
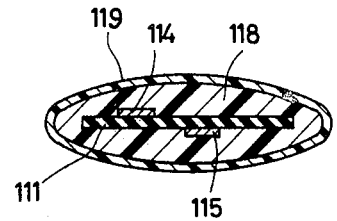

In the embodiment shown in FIGS. 5A and 5B, a resistive or semiconductive resin material was used as the resin layer 118 for covering the element. For the resin layer 118, a material having powder of carbon, metal, metal oxide, semiconductor oxide or semiconductor glass dispersed in epoxy resin can be used. The resistance value thereof may be selected to be $1k\Omega$, $100k\Omega$, $10M\Omega$ and $1000M\Omega$. In the experiment, however, the resistance values of $10M\Omega$ and $1000M\Omega$ were employed. As in the case of the unit dipped in the resistive resin material 118, (as was done in the embodiments shown), a highly insulating and/or wetproof resin layer 119 is preferably further coated. Meanwhile, the insulating resin layer 119 may be of a conventional epoxy resin material. In the embodiment shown, as better seen in FIG. 5B, it follows that the withdrawing electrodes 114 and 115 are electrically connected to each other by the resistive resin 118 and as a result the electrodes 114 and 115 are connected through the resistance of the resin layer 118.

Figure 3:
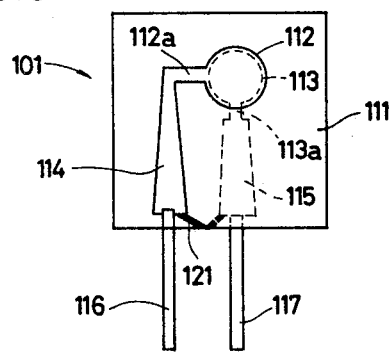
Figure 4:
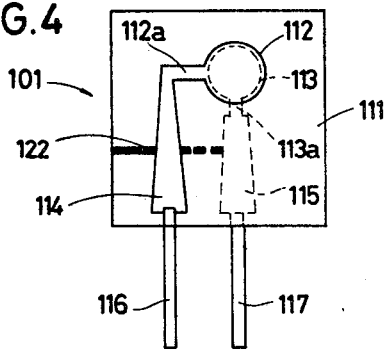

Meanwhile, in the embodiments shown in FIGS. 2, 3 and 4, the unit is dipped with a resin material which is the same as the resin layer 119 used in the embodiment shown in FIGS. 5A and 5B or the ordinary resin where the resistive component has been removed, as previously described.

Now the heat shock test was conducted using the thus fabricated piezoelectric resonator. The conditions of the heat shock test were as follows. More specifically, the unit was maintained for 60 minutes at each of the temperatures of $-50°$ C. and $+100°$ C. and a temperature shift was made from $-55°$ C. to $+100°$ C. in one cycle, and the same operaion of one cycle was repeated for 100 cycles. The temperature shift from $-55°$ C. to $+100°$ C. and back were each made within few seconds.

The result of the heat shock test is shown in Table 3. Referring to Table 3, the embodiments shown in FIGS. 2, 3, 5A and 5B were employed as samples Nos. 2 to 6 and the conventional one shown in FIG. 1 was employed as sample No. 1. In the case of each of these embodiments of the invention, the electric charge generating electrodes are electrically connected across a resistance smaller than that of the piezoelectric ceramic plate. In the case of each of the embodiments the heat shock test was conducted with the previously described conditions. Table 3 shows the result thereof.

Table 3 shows the result of measurement of the characteristic of the piezoelectric resonator ($\Delta f$; the frequency difference of the minimum and maximum frequencies, i.e. the resonance and the antiresonance at the impedances on the occasion of resonances of the element) with respect to the number of test cycles by the heat shock test and the mean value ($\overline{X}$) and the diversification (R) with respect to ten samples are shown.

As seen from Table 3, in the case of a conventional device as shown in FIG. 1, i.e. in the case of no shunt resistance the greater the number of cycles of the heat shock test the larger a change of the thickness $\Delta f$ and the diversification becomes. By contrast, in the case of the FIG. 3 embodiment, referring to the data of the sample No. 2 in the case of the resistive paste 121 being $1k\Omega$, the unit exhibits little change in the thickness $\Delta f$, and diversification only within an acceptable range. Similarly, the sample No. 3 shows a case wherein the fixed resistor element 120 is selected to be $100k\Omega$ in the FIG. 2 embodiment. The sample No. 4 shows a case of the embodiment shown in FIGS. 5A and 5B, wherein the resistance value of the resistive resin layer 118 is selected to be $10M\Omega$. The FIG. 3 embodiment having the resistance value selected to be $10M\Omega$ is shown by the sample No. 5. The embodiment shown in FIGS. 5A and 5B having the resistance value selected to be $1000 M\Omega$ is shown by the sample No. 6. It will be appreciated that the variation and diversification of the thickness $\Delta f$ of the sample Nos. 2 to 6 in Table 3 have been clearly and assuredly improved as compared with such a conventional one as the sample No. 1 shown in FIG. 1.

Figure 6:
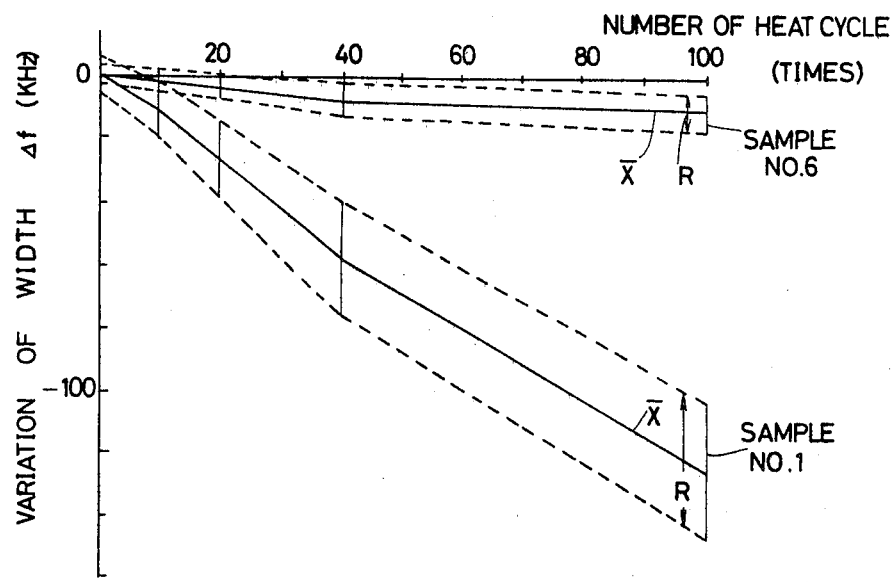
FIG. 6 is a graph showing the width of frequency variation $\Delta f$ of the FIG. 3 embodiment and of the FIG. 35 conventional one.

FIG. 6 is a graph prepared based on the data shown in Table 3 and showing the variation of the thickness Δf of the sample No. 6, i.e. the embodiment shown in FIGS. 5A and 5B having the resistance value of the resin layer 118 selected to be 1000MΩ and the sample No. 1, i.e. the conventional one shown in FIG. 1.

Meanwhile, it is important that the resistance value of the fixed resistive element 120 of the FIG. 2 embodiment, the resistance value of the resistive paste 121 of the FIG. 3 embodiment, and the resistance value of the resin layer 118 of the embodiment shown in FIGS. 5A and 5B are all smaller than the resistance value of the piezoelectric ceramic plate 111. Furthermore, it is also important that in the FIG. 4 embodiment the sum of the resistance value of the respective electrodes 112, 113, 112a, 113a, 114 and 115 formed with the resistive paste and the resistance value of the silver paste 122 be selected to be smaller than the resistance value of the piezoelectric ceramic plate 111. In other words, by evaluating the relation between the resistance value of the ceramic plate of various materials and the variation of the electric characteristic by the heat shock test, it was observed that the variation of the electric characteristic due to the heat shock test becomes smaller when the resistance value of the ceramic plate becomes smaller than a given value. The reason is presumed to be that the electric charge of the counterelectric field opposite to the electric field direction on the occasion of polarization due to the pyroelectric effect is not stored on the electrode facing the ferroelectric ceramic plate but is quickly discharged through the internal resistance of the ceramic plate.

However, as described previously, it has been observed that as the resistance of the ceramic plate increases the piezoelectric characteristic is degraded and the diversification of the electric characteristic is increased and therefore it is necessary to consider another fast discharge way. In other words, this means that it would be better to discharge the electric charge through an external circuit rather than through the internal path of the ceramic plate per se, and accordingly this means that the electrodes where the electric charge is generated should be connected through a resistance which is smaller than the resistance value of the internal path of the ceramic plate (including a case of the resistance being zero). However, in the case of the structure wherein the vibrating electrode surface and the polarization direction intersect each other, it should be adapted such that the inherent operation of the resonator will not be hindered, which naturally results in a limitation to decreasing the resistance value. The lower limit value of the resistance value can not be generally determined and must be determined on a case by case basis.

In the case of the heat shock test, when the temperature is shifted from the low temperature ($-55°$ C.) to the high temperature ($+100°$ C.), an electric field is caused in the forward direction with respect to the polarization direction between the electrodes on both sides of the plate 111 due to the pyroelectric effect, whereas an electric field is generated in the opposite direction due to the pyroelectric effect when the temperature is shifted from the high temperature to the lower temperature. It is presumed that the polarization of the plate 111 reverts due to the alternating electric field, thereby to decrease the piezoelectric characteristic. Therefore, according to the present invention, the electrodes on both surfaces of the plate 111 are electrically connected with a given resistance value, thereby to mitigate the alternating current electric field.

Figure 7A:
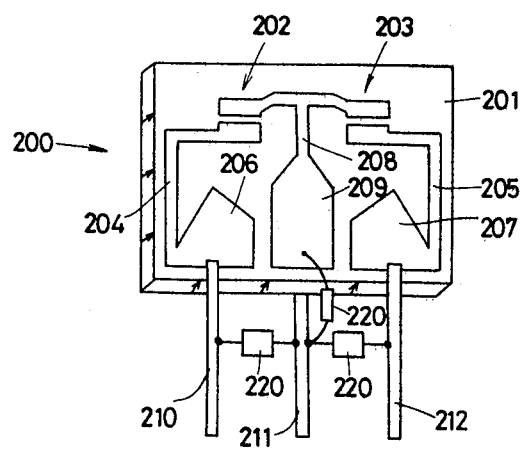
Figure 7B:
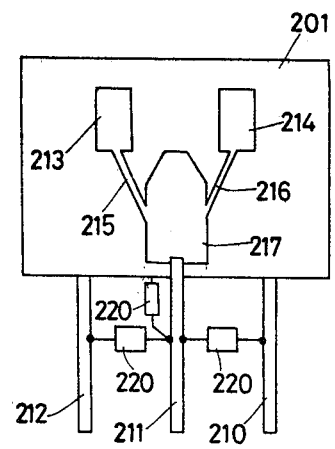

FIGS. 7A and 7B are views showing one example of an energy trapped three-terminal piezoelectric filter in accordance with another embodiment of the present invention, wherein FIG. 7A shows one surface of the filter and FIG. 7B shows the other surface of the filter. Since the fundamental structure of such piezoelectric filter itself is well-known to those skilled in the art, only a portion associated with the present invention will be briefly described in the following.

The filter element 200 comprises a piezoelectric ceramic plate 201, which may be of a ceramics of the barium titanate group, the lead titanate group, or the lead titanate zirconate group. Two pairs of electrodes 202 and 203 are formed on one main surface of the piezoelectric ceramic plate 201 and the common electrodes 214 and 213 are formed to be facing these electrodes 202 and 203. One end of each of the electrodes 202 and 203 is connected to the withdrawing electrodes 206 and 207 through the lead electrodes 204 and 205. The other end of each of the electrodes 202 and 203 is commonly connected to the electrode 209 through the lead electrode 208. The electrode 217 is formed on the rear surface of the plate 201 so as to be opposed to the electrode 209. The electrode 217 is connected to the common electrodes 214 and 213 by means of the lead electrodes 216 and 215. The electrodes 202 and 214 facing each other with the plate 201 therebetween constitute a single vibrating portion and the electrodes 203 and 213 opposing each other constitute a single vibrating portion. The electrodes 209 and 217 facing each other with the plate 201 therebetween constitute a capacitor and accordingly the electrodes 209 and 217 function as capacitor electrodes. The lead electrode 206, the capacitor electrode 217 and the lead electrode 207 are connected to the withdrawing electrodes 210, 211 and 212, respectively, by soldering. The element thus fabricated is coated with a resin layer, not shown, whereby a three-terminal filter element is completed.

In the embodiment shown in FIGS. 7A and 7B, the withdrawing terminals 210, 212 and 209 are connected to the withdrawing terminal 211 through the discrete resistor elements 220. FIGS. 8, 9, 10A and 10B are views showing 3-terminal filter elements in accordance with a further embodiment of the present invention.

In the FIG. 8 embodiment, the resistive pastes 221 are formed on both surfaces of the plate 201, whereby the withdrawing electrode 206 and the capacitor electrode 217, the withdrawing electrode 207 and the capacitor electrode 217, and the electrode 209 and the capacitor electrode 217 are electrically connected, respectively. Meanwhile, the resistive pastes 221 may be formed at the positions as shown as 222 in FIG. 9, whereby the withdrawing electrodes 206 and 207 and the electrode 209 may be connected to the capacitor electrode 217. In other words, the connection positions may be arbitrarily determined, insofar as the same is suited for the purpose of the present invention.

In the FIG. 9 embodiment, the electrodes 202 to 209 and 213 to 217 are formed not as a silver electrode by means of an evaporation process or a sputtering process but rather formed as a resistive metal such as a tantalum or titanium or metal oxide such as tin oxide by means of an evaporation process or a sputtering process. Then the silver pastes 222 (the resistance value is approximately zero) are formed on both surfaces of the plate 201, whereby the electrodes 204 and 216, the electrodes 215 and 205, and the electrodes 209 and 217 are directly connected, respectively. Although not shown, short-circuiting lead wires may be used in place of the silver paste 222, as a matter of course, and such connection portions may be determined arbitrarily, provided they are suitable for the purpose of the present invention. Furthermore, the silver pastes 222 and the short-circuiting lead wires may a substantial resistive component.

In the embodiment shown in FIGS. 10A and 10B, the resin coating layer 218 is formed with a resistive or semiconductive resin. Then the resin layer 218 is further covered with a highly insulating and/or moistureproof resin layer 219. In either embodiment, the electric charge generating electrodes are connected with a resistance value smaller than that of the piezoelectric ceramic plate between such electric charge generating electrodes. In the case of any of the embodiments, the heat shock test was conducted with the previously described conditions. The result is shown in Table 4.

Table 4 shows the result of measurement of the characteristic (insertion loss and center frequency) of the three-terminal filter element by the heat shock test with respect to the number of test cycles, wherein mean value ($\overline{X}$) and the diversification (R) are shown with respect to ten samples.

Sample No. 1 is a conventional one with the resistor 220 removed from the embodiment shown in FIGS. 7A and 7B. Sample No. 2 is the embodiment shown in FIGS. 10A and 10B, with the resistance value selected to be 1kΩ. Sample No. 3 is the FIG. 8 embodiment, with the resistance value selected to be 100kΩ. Sample No. 4 is the embodiment shown in FIGS. 10A and 10B, with the resistance value selected to be 10MΩ. Sample No. 5 is the embodiment shown in FIGS. 7A and 7B, with the resistance value of the fixed resistor element selected to be 10MΩ. Sample No. 6 is the FIG. 8 embodiment, with the resistance value selected to be 1000MΩ.

As seen from Table 4, in the absence of the insertion resistance in a conventional one, the more the number of cycles the larger the variation of the diversification loss and the center frequency and the more the diversification become. By contrast, as seen from the data in conjunction with samples Nos. 2 to 6, according to the present invention the variation of the insertion loss and the center frequency is not so large even after a large number of cycles increases and the diversification is within an acceptable range.

Figure 11:
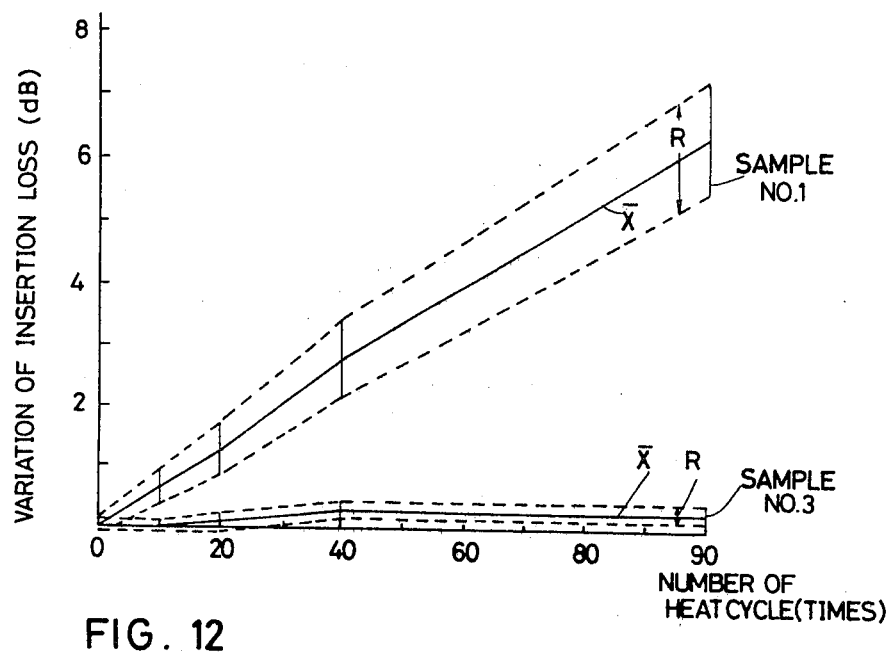
FIG. 11 is a graph showing the variation of the insertion loss of the FIG. 8 embodiment and of a conventional piezoelectric ceramic filter.
Figure 12:
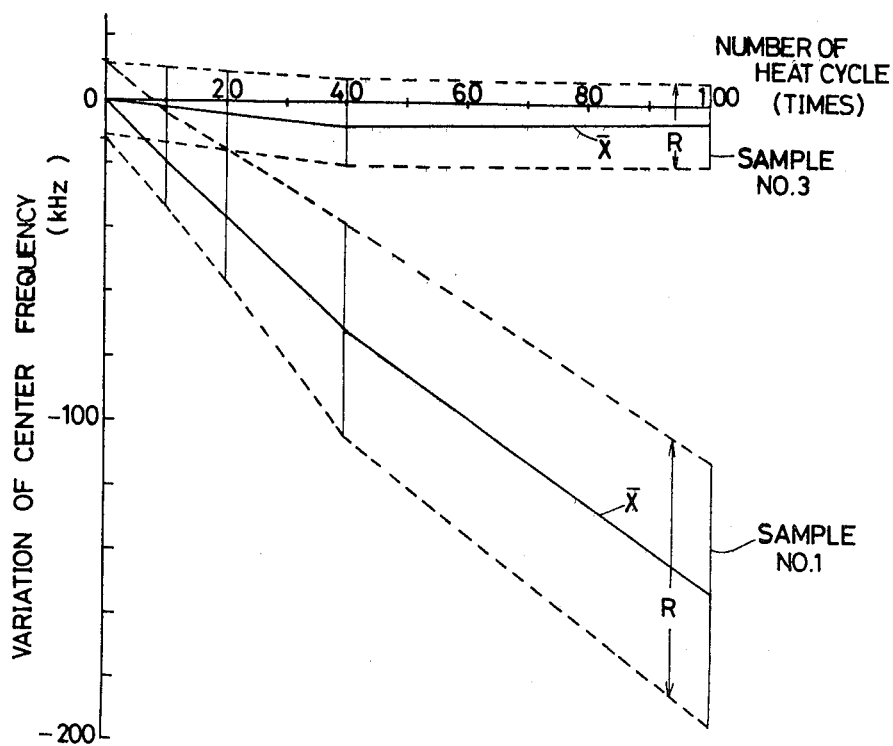
FIG. 12 is a graph showing the variation of the center frequency of the FIG. 8 embodiment and of a conventional piezoelectric filter.

FIG. 11 is a graph showing the variation of the insertion loss with respect to the number of cycles for samples Nos. 1 and 3. FIG. 12 is a graph showing the variation of the center frequency with respect to the number of cycles for the same samples.

Figure 13:
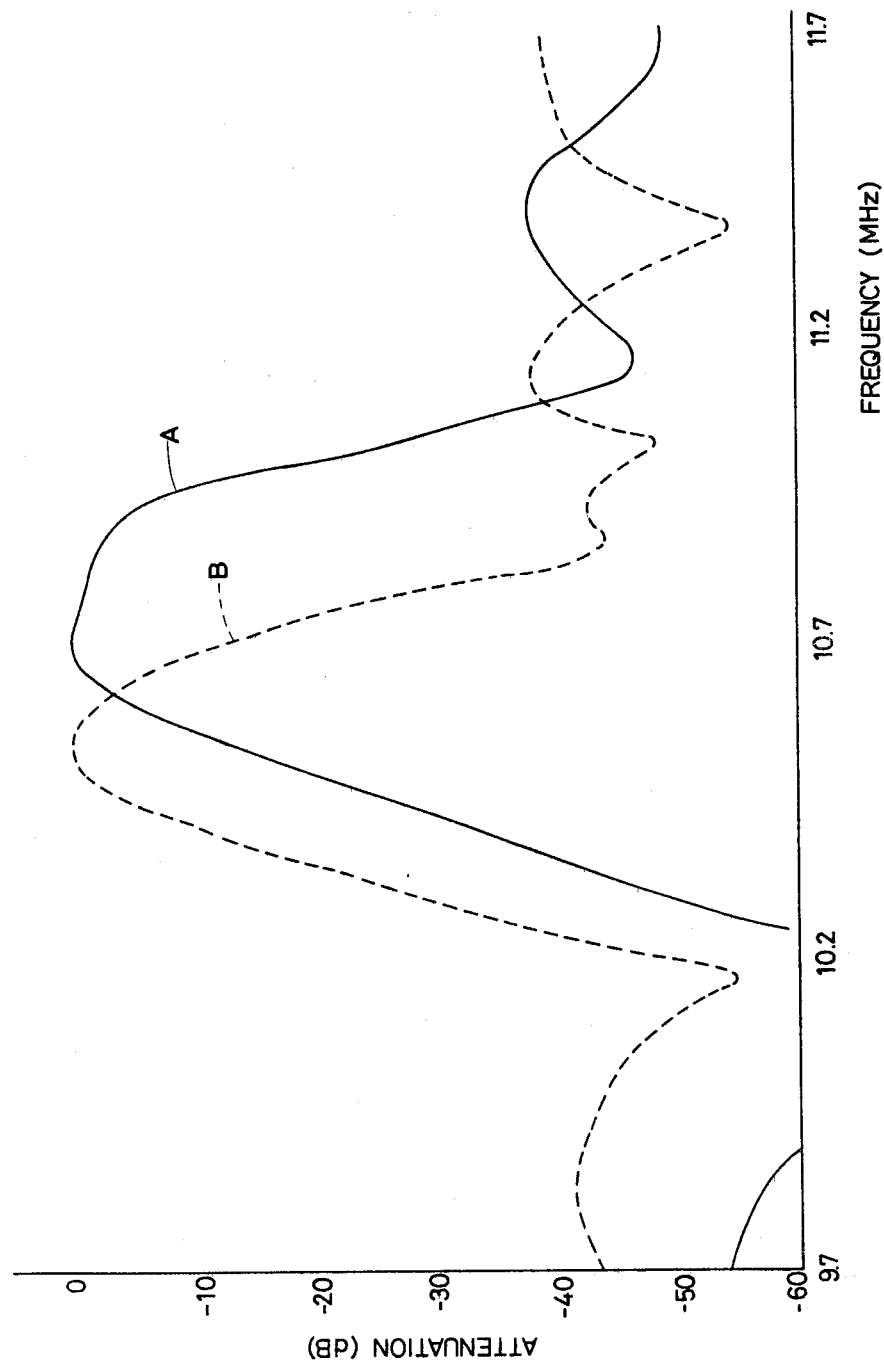
FIG. 13 is a graph showing the frequency response before and after the heat shock test of a conventional piezoelectric ceramic filter.
Figure 14:
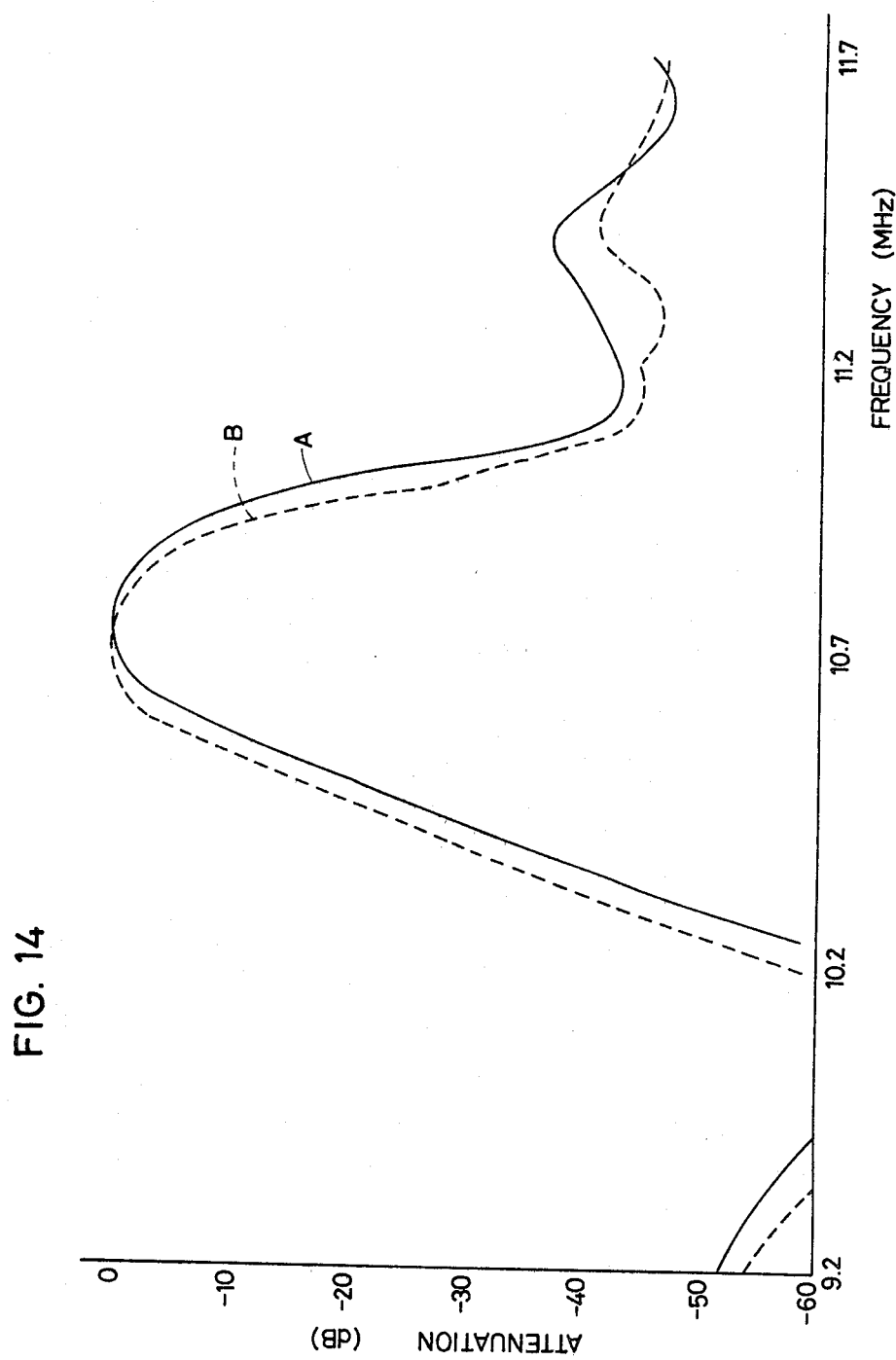
FIG. 14 is a graph showing the frequency response before and after the heat shock text of the piezoelectric ceramic embodying the present invention, such as the FIG. 8 embodiment.

FIG. 13 is a graph showing the variation of the filter characteristic of sample Nos. 1 and FIG. 14 is a graph showing a variation of the filter characteristic of sample No. 3. Referring to FIGS. 13 and 14, the solid curve A shows the characteristic of the filter before the heat shock test and the curve B shows the characteristic of the filter after the heat shock test of 100 cycles. As seen from FIG. 13, the conventional device exhibits a greatly changed central frequency characteristic and also exhibits a remarkable change in the attenuation characteristic, after the heat shock test of 100 cycles was conducted. By contrast, the filter embodying the present invention exhibits little shift of the central frequency and little change of the attenuation characteristic, even after the heat shock test of 100 cycles was conducted.

In the foregoing, the embodiments were shown as employing, as a resistor, a baked resistor, a fixed resistor element or the like. Furthermore, an example was shown in which resin serving as a resistive element was employed. However, semiconductor glass, paste, semiconductor oxide powder, paste like semiconductor resin and the like may be used for the purpose of the present invention and the point is that the resistor inserted state need be designed taking the circuitry with which it is to be used into consideration.

Furthermore, in the previously described embodiments, an electric connection was established such that a resistance is substantially inserted between the electrodes formed on both surfaces of the piezoelectric plate; however the respective electrodes may be separately connected to the ground potential with a given resistance value and a point is that a positive charge and a negative charge generated by the pyroelectric effect are mitigated instantaneously.

In the above described embodiment, the conductive member where the electric charge is stored constitute a vibrating electrode and other incidental electrode provided on the piezoelectric ceramic plate and the polarization axis direction is perpendicular to the plane of the piezoelectric ceramic plate where these electrodes are formed; however, further different examples to be described in the following may be considered.

Figure 15:
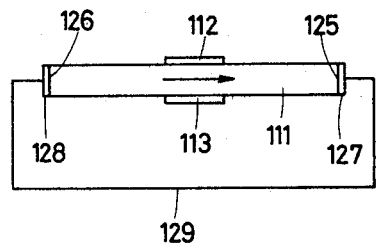
FIG. 15 is an outline side view showing another example of a piezoelectric ceramic resonator in accordance with one embodiment of the present invention.

FIG. 15 shows another structure of the piezoelectric resonator, which is primarily used as a trap element, wherein the polarization direction of the ferroelectric ceramic plate 111 is parallels to the plane of the plate and is used in the so-called thickness shear vibration mode. In such a case, the ceramic plate 111 is of a square of 5 mm by 5 mm and 0.2 mm thick and the resistance value between the surfaces 125 and 126 in the polarization direction is $1 \times 10^{14}\Omega$. The vibrating electrodes 112 and 113 of 2 mm diameter serving as one of the conductive members and other incidental electrodes (although not shown), are formed on the opposing main surfaces of the ceramic plate 111. The electrodes 127 and 128 serving as the conductive members are also formed on the side surfaces 125 and 126 of the ceramic plate 111 by means of the conventional well-known method. The resonance frequency is selected to be approximately 50 MHz.

With such a structure, the conductive member on the side where the electric charge is stored due to the temperature change mainly comprises the electrodes 127 and 128 and does not comprise the vibrating electrodes 112 and 113. Accordingly, in order to apply the present invention to such structure, the electrodes 127 and 128 may be electrically connected through a resistor by means of the short-circuiting lead wire 129, as shown in the figure. In such a case, the electrodes 127 and 128 may be made of a material having a resistivity by itself, such as a resistive metal oxide. Furthermore, the electrodes 127 and 128 may be electrically connected to the ground potential without being connected to each other.

Figure 16:
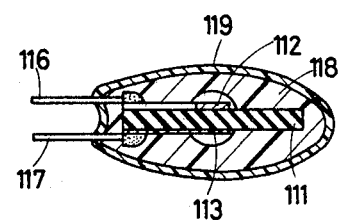
FIG. 16 is an outline sectional view showing a further example of a piezoelectric ceramic resonator in accordance with one embodiment of the present invention.

Furthermore, the structure shown in FIGS. 5A and 5B may be applied as one example of the package structure of the piezoelectric resonator. In such a case, the electrodes 127 and 128 may be dispensed with, as shown in FIG. 16. Even in the case of the embodiments of FIGS. 15 and 16, the point is that a circuit for discharging the generated electronic charge is formed. Thus, the generated electric charge discharging structure as depicted with reference to FIG. 13 can be applied not only to the two-terminal type resonator but also to such a filter as shown in FIGS. 7A and 41B employing a thickness shear vibration mode.

Although the above described embodiments are mainly examples employing a thickness expansion or a thickness shear vibration mode it is pointed out that the present invention can be equally applied to those examples employing a thickness twist vibration mode or an electric field parallel type thickness shear vibration mode. In the lower frequency region, not a thickness vibration mode but a split ring vibration mode, a bending vibration mode, an expansion vibration mode, a radial directional vibration mode, an edge vibration mode or the like may be employed. It is pointed out that the present invention can be equally applied to those devices employing such vibration mode. In the following, a typical structure of a bulk wave resonator will be described.

Figure 17:
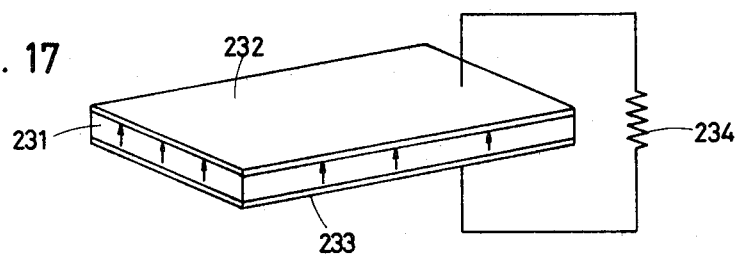
FIG. 17 is an outline perspective view of a rectangular plate type resonator in accordance with one embodiment of the present invention.

FIG. 17 is a so-called rectangle plate type resonator having the electrodes 232 and 233 formed on both main surfaces of a rectangular ceramic plate 231. Since the polarization direction is selected to be in the thickness direction, any suitable structure employed in the previously described embodiments may be employed in electrically connecting the electrodes 232 and 233 by the resistor 234, as shown.

Figure 18:
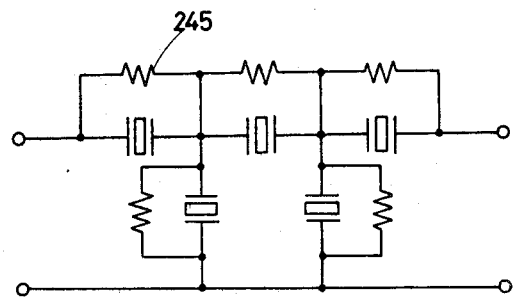
FIG. 18 is a schematic diagram of a ladder type filter.
Figure 19:
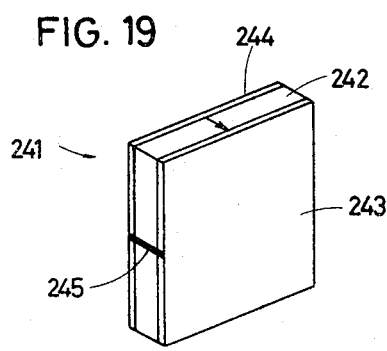
FIG. 19 is an outline perspective view of a resonator in accordance with one embodiment of the present invention which can be employed in the FIG. 18 ladder type filter.

FIG. 18 shows a schematic diagram of a ladder type filter embodying the present invention and FIG. 19 shows a rectangular plate type piezoelectric resonator 241 employing an edge vibration mode for use in such filter. In such a case as well, since the polarization direction is the thickness direction, the whole surface electrodes 243 and 244 are formed on both main surfaces of the ceramic plate 242, as shown and both electrodes 243 and 244 are connected by the resistor paste 245. Alternatively, any suitable structure employed in the previously described embodiments may be employed.

Figure 20:
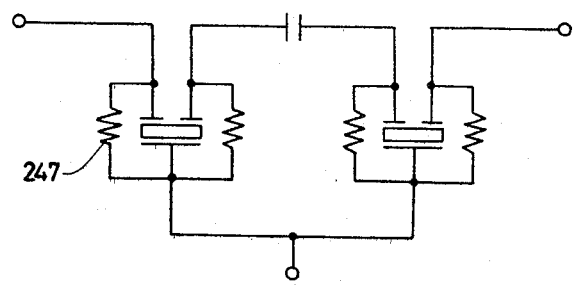
FIG. 20 is a schematic diagram of a three-terminal type filter.
Figure 21:
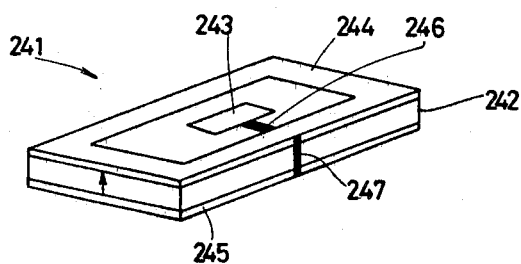
FIG. 21 is an outline perspective view showing a three-terminal type filter element for use in the FIG. 20 embodiment.

FIG. 20 shows a schematic diagram of the so-called three terminal type filters employing a edge vibration mode connected by a series coupling capacitance and employing the present invention and FIG. 21 shows a three-terminal type filter 241 employing the FIG. 20 filter. Even in such a case, the polarization direction is the thickness direction and therefore a dot electrode 243 and a ring electrode 244 are formed in a concentric manner on one main surface of the ceramic plate 242, as shown, and the whole surface electrode 245 is formed on the other main surface of the ceramic plate 242. The electrodes 243 and 244 are connected by the resistive pastes 246 and the electrodes 244 and 245 are connected by the resistive paste 257. Alternatively, any suitable structure employed in the previously described embodiments may be employed in the embodiment shown.

Figure 22:
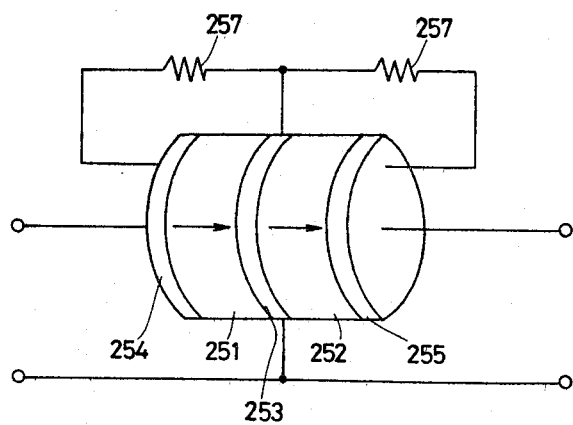
FIG. 22 is an outline perspective view of a disc composite type filter in accordance with one embodiment of the present invention.

FIG. 22 shows the so-called disc composite type filter wherein the common electrode 253 is formed on the junction surface of the disc ceramic plates 251 and 252, the input or output electrode 254 is formed on the ceramic plate 251, and the output or input electrode 255 is formed on the ceramic plate 252. The polarization direction is the thickness direction and therefore the electrodes 253 and 254 and the electrodes 253 and 255 are electrically connected, as shown, wherein any suitable structure as described in conjunction with the previously described embodiments may be employed.

Meanwhile, in the case where the polarization axis direction is oblique with respect to the plate surface, the embodiment in the case where the polarization axis direction is orthogonal to the plane of the plate and the embodiment in the case where the polarization axis direction is in parallel with the plane of the plate may be suitably combined depending on the magnitude of the electric charge generated due to the temperature change.

FIGS. 23 to 27 show in succession the steps of a process for manufacturing another example of a piezoelectric resonator in accordance with one embodiment of the present invention.

First referring to FIG. 23, a piezoelectric unit 101 is prepared. The piezoelectric unit 101 comprises a ferroelectric ceramic plate 111 of a lead titanate zirconate, for example. The vibrating electrodes 112 and 113 are formed to be faced to each other on the plate 111. The vibrating electrode 112 is connected to the withdrawing electrode 114 by means of the lead electrode 112a. The vibrating electrode 113 on the rear surface of the plate is connected to the withdrawing electrode 115 by means of the lead electrode 113a. The lead electrodes 114 and 115 are connected to the withdrawing terminals 116 and 117 by soldering. In such a state, the element is covered with the insulating resin layer 119' using a well-known process as disclosed in Japanese Patent Publication No. 22384/1970, for example, as shown in FIGS. 24A and 24B, thereby to complete the piezoelectric unit 101.

FIG. 25 is a view showing one example of a metallic case for use in the present invention. The metallic case 52' is provided with a space 53' large enough to accommodate the piezoelectric unit 101 in a state as shown in FIG. 24. The metallic case 52' is used to enhance the moistureproofness and the magnetic shielding property and ensure the high quality of the product.

Then, as shown in FIG. 26, the piezoelectric unit 101 covered with the resin layer 119' is inserted into the space 53' of the metallic case 52' in the direction as shown.

Then, as shown in FIG. 27, a filler or a potting meterial is filled between the metallic case 52' and the resin layer 119' and between the respective withdrawing terminals 116 and 117. The filler 54' fixes the piezoelectric unit 101 to the metallic case 52'. At that time, a resistive paste is used as the filler 54', wherein the resistance value thereof is selected such that the resistance value smaller than that of the unit (the ferroelectric ceramic plate 101) appearing between the terminals before the filler 54' is filled is connected in parallel between the terminals. (By "between the terminals", is meant a portion between the terminals where the positive and negative electric charges are stored due to a temperature change of the ferroelectric ceramic plate, as to be described subsequently). As such filler 54', one having carbon powder dispersed in epoxy resin, one having metal oxide powder dispersed in phenol resin, one having semiconductor powder dispersed in phenol resin, one having metal powder dispersed in silicone resin, or any suitable combination thereof may be utilized. As seen from FIG. 27, it follows that the respective withdrawing terminals 116 and 117 are electrically connected by means of the filler 54' (the resistive paste). By employing such a structure, the insertion loss and the central frequency of the device are likely to be less changeable with respect to the heat shock test. The reason why such stabilized characteristic can be attained may be presumably explained in the following manner. More specifically, a piezoelectric resonator comprising a ferroelectric ceramic of such as the barium titanate group, the lead titanate zirconate group, the lead titanate group or the like is responsive to a change of the ambient temperature, thereby causing a pyroelectric effect due to the change of the spontaneous polarization at the electrode portions, whereby an electric charge is generated on the electrodes. Such electric charge serves as a counterelectric flied causing a polarization in the direction opposite to the direction of the direct current electric field used for of the polarizing treatment, with the result that the piezoelectric characteristic of the plate is degraded. However, if and when the withdrawing terminals connected to the conductive members formed on the surface of the plate are electrically connected by means of a filler material or a potting material such as a resistive paste, as done in the above described embodiment, the electric charge generated by the pyroelectric effect is discharged through the resistive paste and as a result no counterelectric field is caused and degradation of the piezoelectric characteristic of the plate can be prevented. Accordingly, it is necessary that the resistive paste being used have a resistance value smaller than that of the plate itself.

Although the foregoing embodiment was an example wherein the electrodes formed on both main surfaces of the plate 101 are formed with a conductive member, the same may be formed with a resistive film or a semiconductive film of such as a resistive paste, for example. In such a case, the resistance value of the resistive paste serving as a filler material need be selected in consideration of a relation with the resistance value of the electrodes.

Although the above described embodiments were directed to an energy trapped two-terminal type piezoelectric resonator, the present invention can also be applied to an energy trapped dual mode filter, a non-energy trapped type resonator and filter, in addition to the above described embodiments. Furthermore, the outer package of the piezoelectric unit may be not only a structure for covering with an insulating resin material but also a case, for example, made of an insulating resin material. The point is that the present invention can be clearly applied to all of the ones having the terminals where the positive and negative electric charges are stored due to a temperature change of the ferroelectric ceramic plate withdrawn externally of an outer package made of such an insulating resin material (the ones which are naturally considered from the inherent structure of the piezoelectric unit or the ones having the terminals where the electric charge intentionally provided for withdrawal externally of the outer package).

Figure 28:
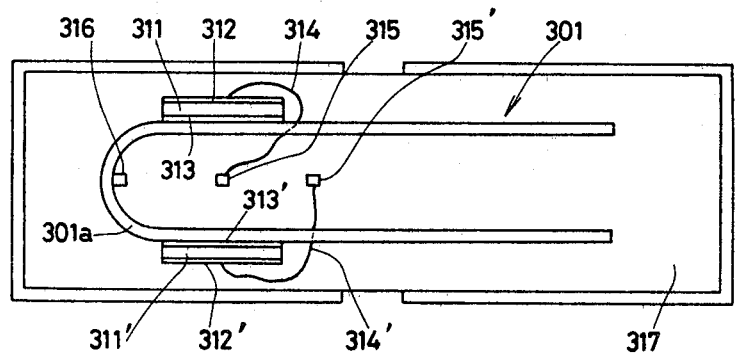
Figure 29:
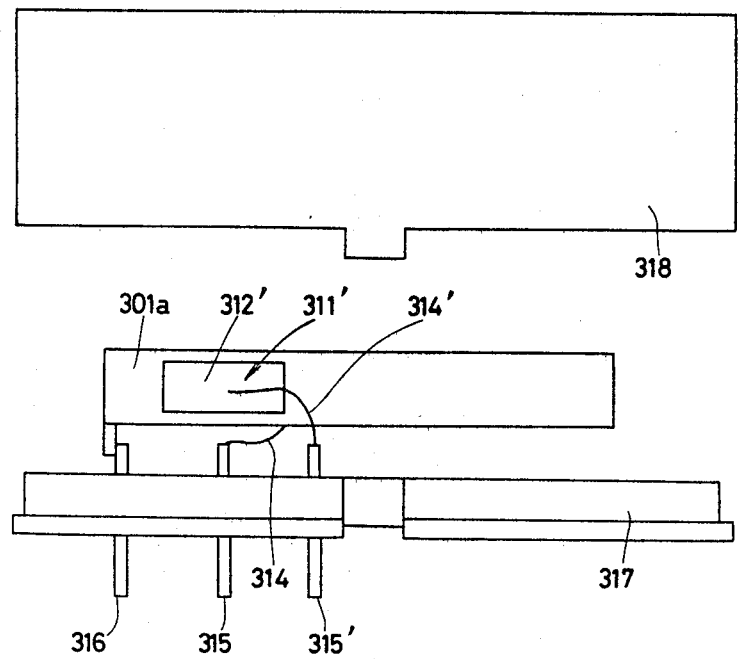

FIGS. 28 and 29 are views showing a piezoelectric tuning fork as one example of a mechanical resonator using a piezoelectric transducer embodying the present invention. Since the fundamental structure of such piezoelectric tuning fork is well-known to those skilled in the art, only those portions associated with the present invention will be briefly described. The piezoelectric tuning fork 301 is provided with opposing electrodes and comprises piezoelectric plates 311 and 311' of rectangular plates of 1.7×7×0.2 mm adhered to the node portion of vibration of the tuning fork fingers or to the vicinity thereof. More specifically, the piezoelectric plate 311 (since the piezoelectric plate 311' is the same, the piezoelectric plate 311' will not be explained in the following; likewise, those reference characters with a prime are the same as those without a prime and will not be explained) is made of a ferroelectric ceramic of the lead titanate zirconate group, for example, and has been polarized in the thickness direction. The electrodes 312 and 313 are formed to be faced to each other on the piezoelectric ceramic plate 311. The electrode 312 is connected to the withdrawing terminal 315 by means of the lead 314. A protrusion integrally formed on the edge portion of the base portion 301a of the tuning fork 301 is fixed to the common withdrawing terminal 316. The withdrawing terminals 315 and 315' and the common withdrawing terminal 316 are maintained in a state of penetration through the resin base 317 and the inside has been shielded with the base 317 and the conductive case 318.

Figure 30:
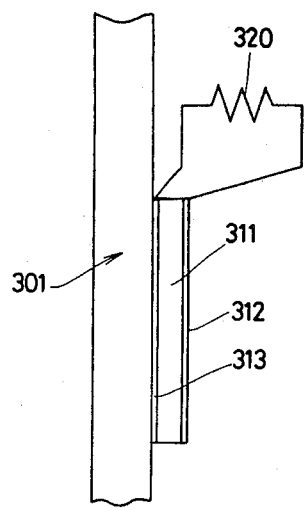
FIGS. 30 and 32 are outline side views of major portions of different examples of a piezoelectric tuning fork in accordance with one embodiment of the present invention.

FIG. 30 and further figures show different embodiments of the present invention, wherein only major portions are shown. It is self-evident that an actual piezoelectric tuning fork in practice is not limited to such a structure as shown in FIGS. 25 and 29. The size of the piezoelectric plate 311 and the size of the electrodes 312 and 313 are the same as those in FIGS. 28 and 29. In these embodiments, the ceramic of the lead titanate zirconate group of a composition such as $(Pb_{0.95}Sr_{0.05})(Ti_{0.48}Zr_{0.52})O_3 + 0.75$ wt% $Nb_2O_5 + 0.15$ wt% $Cr_2O_3 + 0.5$ wt % $MnO_2$ was employed for the piezoelectric plate, as in the case of the embodiment shown in FIGS. 28 and 29. In the case where the above described ceramic is utilized, the resistance value between the electrodes 312 and 313 in a conventional structure without the present invention was $7 \times 10^{11} \Omega$.

In the FIG. 30 embodiment, a fixed resistor 320 was connected beteen the electrodes 312 and 313. Although a resistor of any value such as $1k\Omega$, $100k\Omega$, $10M\Omega$ or $1000M\Omega$ may be used, the embodiment employed the resistive element of $100k\Omega$. The connection portion of the resistor 320 may be arbitrarily determined between the electrodes 312 and 313, insofar as the same is suited to the purpose of the present invention.

Figure 31:
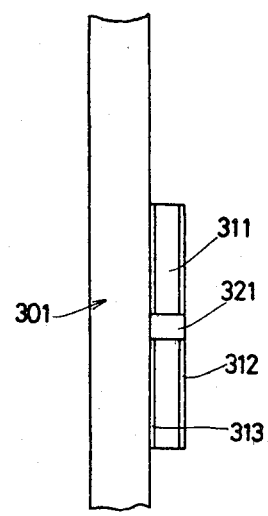

In the FIG. 31 embodiment, the resistive paste 321 is baked on the side surface and between both surfaces of the piezoelectric ceramic plate 311, whereby the electrodes 312 and 313 were connected with a given resistance value. As the resistive paste 321, one having carbon powder dispersed in phenol resin, for example, was employed, and the resistor paste 321 of $1k\Omega$ or $10M\Omega$ was baked in the experiment, although the resistance value may be such as $1k\Omega$, $100k\Omega$, $10M\Omega$ and $1000M\Omega$. Meanwhile, the resistive paste 321 is formed at the position 322 in FIG. 32, whereby the electrodes 312 and 313 are connected. In other words, the connection portion may be arbitrarily selected, insofar as the same is suited to the purpose of the present invention.

Figure 32:
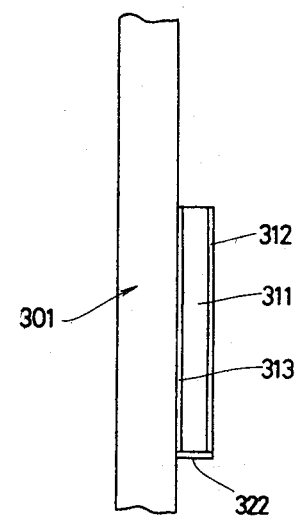

Although in the embodiments previously described or to be described subsequently in conjunction with FIGS. 30, 31 and 33, the electrodes were implemented as silver electrodes having a resistance value being approximately zero formed in accordance with an evaporation process or a sputtering process, in the FIG. 32 embodiment these electrodes are formed with a resistive metal (such as tantalum or titanium) or resistive metal oxide (such as tin oxide) in accordance with an evaporation process or a sputtering process. In the embodiment shown, the silver paste 322 having the resistance value of approximately zero is baked on the side surface and between both surfaces of the piezoelectric plate 311, whereby the electrodes 312 and 313 are directly connected rather than through a resistor. Of course, the electrodes may be short-circuited using a lead wire, not shown, in place of the silver paste 322 and the connection portion thereof may be arbitrarily selected, insofar as the same is suited to the purpose of the present invention. Furthermore, the silver paste 322 or the shortcircuiting lead wire may have a substantial resistance component. The resultant resistance value of these electrodes and the silver paste 322 or the short-circuiting lead wire must be selected to be smaller than the resistance value between the electrodes 312 and 313 of the piezoelectric ceramic plate 311 per se.

Figure 33:
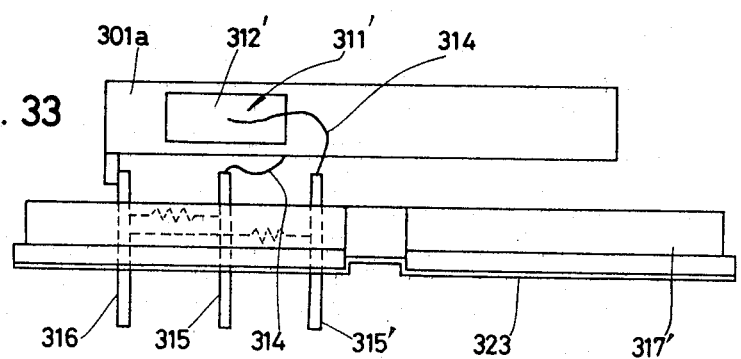
FIG. 33 is a view showing another example of a tuning fork in accordance with one embodiment of the present invention.

In the FIG. 33 embodiment, a resistive or a semiconductive resin material is used as a material for forming the base 317'. As the material for the base 37', one having powder of carbon, metal, metal oxide, or semiconductor oxide or powder of semiconductor glass dispersed in epoxy resin may be used. Although the resistance value may be selected to be 1kΩ, 100kΩ, 10MΩ or 100MΩ, in the experiment the resistance values of 10MΩ and 1000MΩ were employed. In the case where the resistive paste 317' is used as in the embodiment shown, the base 317' is further coated with a highly insulating and/or wetproof resin layer 323. The insulating resin layer 323 may be of a conventional epoxy resin material. In the embodiment shown, when the electrode 313 is electrically conductive to the tuning fork base 301a, it follows that the withdrawing terminal 315 and the common withdrawing terminal 316 are connected to each other by means of the resistive base 317' and accordingly the electrodes 312 and 313 are connected through the resistive paste 317'.

The piezoelectric tuning fork thus formed was then subjected to the heat shock test. The conditions of the heat shock test were as follows. More specifically, the tuning fork was maintained for 60 minutes at each of the temperatures of $-55°$ C. and $+100°$ C., the temperature being shifted from $-55°$ C. to $+100°$ C. between the two 60 minute periods, and such cycle was repeated for 100 times or for 100 cycles. The temperature shifts from $-55°$ C. to $+100°$ C. and back were each made within a few seconds.

The result of the heat shock test is shown in Table 5. In Table 5 those embodiments shown in FIGS. 30, 31 and 33 were used as samples Nos. 2-6, and the conventional device shown in FIG. 28 was used as sample No. 1. In the case of each of the embodiments, the charge generating electrodes are connected with a resistance value smaller than the resistance value of the piezoelectric ceramic plate between the electric charge generating electrodes. In case of any of the embodiments, the heat shock test was conducted under the previously described conditions. The result is shown in Table 5.

Table 5 shows the result of measurement of the characteristic (the insertion loss and the resonance frequency) of the piezoelectric resonator due to the heat shock test with respect to the number of test cycles.

As seen from Table 5, in the case of the conventional devices shown in FIGS. 28 and 29 without a shunt resistor, the more the number of cycles of the heat shock the larger the change of the insertion loss and the change of the resonance frequency. By contrast, referring to the FIG. 31 embodiment, the example where the resistive paste 321 was selected to be 1kΩ, i.e. sample No. 2, exhibited little change in the insertion loss and a variance of the resonance frequency fr within the allowed range. Likewise, the FIG. 30 embodiment with the fixed resistive element 320 selected to be 100kΩ is shown as sample No. 3. The FIG. 33 embodiment with the resistive resin paste 317' selected to be 10MΩ is shown as sample No. 4. Furthermore, FIG. 32 embodiment with the resistance value selected as 10MΩ is shown as sample No. 5 and the FIG. 33 embodiment with the resistance value selected to be 1000MΩ is shown as sample No. 6. Thus it wil be appreciated that the change of the insertion loss and the change of the resonance frequency of sample Nos. 2 to 6 in Table 5 have been clearly and assuredly improved as compared with the conventional device shown in FIGS. 28 and 27, i.e. sample No. 1.

FIG. 68 is a graph prepared based on the data shown in Table 5 and shows the variations of the insertion loss and the resonance frequency between sample No. 6, i.e. the FIG. 67 embodiment with the resistance value of the resin base 317' selected to be 1000MΩ and sample No 1, i.e. the FIG. 62 conventional device.

Meanwhile, it is required that the resistance value of the fixed resistor element 320 in the FIG. 30 embodiment, the resistance value of the resistive paste 321 in the FIG. 31 embodiment, and the resistance value of the resin base 317' of the FIG. 33 embodiment are all smaller than the resistance value between the electrodes 311 and 312 of the piezoelectric ceramic plate 311. Furthermore, in the case of the FIG. 32 embodiment, the total sum of the resistance value of the respective electrodes 312 and 313 formed with the resistive paste and the resistance value of the silver paste 322 must be selected to be smaller than the resistance value between the electrodes 311 and 312 of the piezoelectric ceramic plate 311. In other words, by evaluating the relation between the resistance value of the ceramic plate of various materials and the change of the electric characteristic due to the heat shock test, it was discovered that as the resistance value of the ceramic plate becomes small the change of the electric characteristic due to the heat shock test becomes small. The reason is presumed to be that the electric charge of the counterelectric field opposite to the direction of the electric field on the occasion of polarization due to the pyroelectric effect is not stored on the electrodes facing to each other of the ferroelectric ceramic plate but is quickly discharged through the internal path of the ceramic plate.

However, it was also discovered that as the resistance of the ceramic plate decreases as described above the piezoelectric property decreases and the diversification of the electric characteristic decreases. Therefore, another natural discharge path for decreasing the resistance value of the piezoelectric ceramic plate per se must be considered. In other words, this means that it would be better to discharge the electric charge through an external circuit than through an internal path of the ceramic plate and accordingly the electrodes where the electric charge are generated are connected with a resistance smaller than the resistance value inside the ceramic plate, including the case of the shunt resistance being zero. However, in the case of the structure where the electrode plane intersects the polarization direction, it is necessary that the inherent operation of the piezoelectric transducer not be hindered, which means that there is a limitation to the practical decrease of the resistance value. Since this lower limit cannot be generally determined, it must be determined on a case by case basis.

In the case of the heat shock test, when the temperature is shifted from the low temperature ($-55°$ C.) to the high temperature ($+100°$ C.), an electric field is generated in the forward direction of the polarization direction between the electrodes on both sides of the plate 311 and when the temperature shift is from the high temperature to the low temperature an electric field is generated in the reversed direction. It is presumed that the polarization of the plate 311 is gradually lost by exposure such an alternating electric field and that a decrease of the piezoelectric property is caused thereby. Therefore, according to the present invention, for the purpose of mitigating instantaneously such alternating electric field, the electrodes on both surfaces intersecting the polarization direction of the plate 311 are electrically connected with a given resistance value.

In the above described embodiment, a baked resistor, a fixed resistor and the like were employed as a resistance. Furthermore, an example of using resin serving as a resistor at the same time was also described. However, for the purpose of the present invention, a semiconductor glass paste, semiconductor oxide powder paste, semiconductor resin and the like may be used and a point is that the state of a resistance being inserted must be designed taking into consideration the circuitry in which it is to be used.

Furthermore, although in the above described embodiments the electrodes formed on both surfaces of the piezoelectric plate were electrically connected with a resistance being inserted, the same situation may be established such that the respective electrodes are separately connected to the ground potential with a given resistance value, including zero, the point being that the positive and negative electric charges generated due to the pyroelectric effect must be decreased promptly.

Although in the foregoing there described embodiments having the conductive members where the electric charges are stored being formed as the electrodes with the polarization axis direction being perpendicular to the plane of the piezoelectric ceramic plate where these electrodes are provided, the following examples may be further considered.

Figure 35:
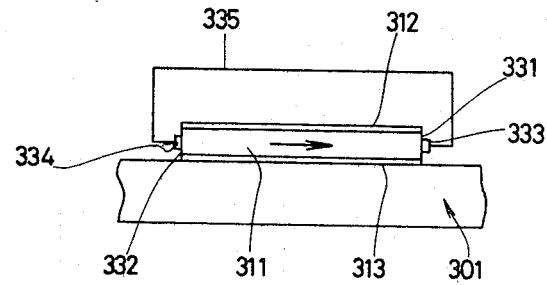
FIG. 35 is a view showing another example of a piezoelectric tuning fork in accordance with one embodiment of the present invention.
Figure 34:
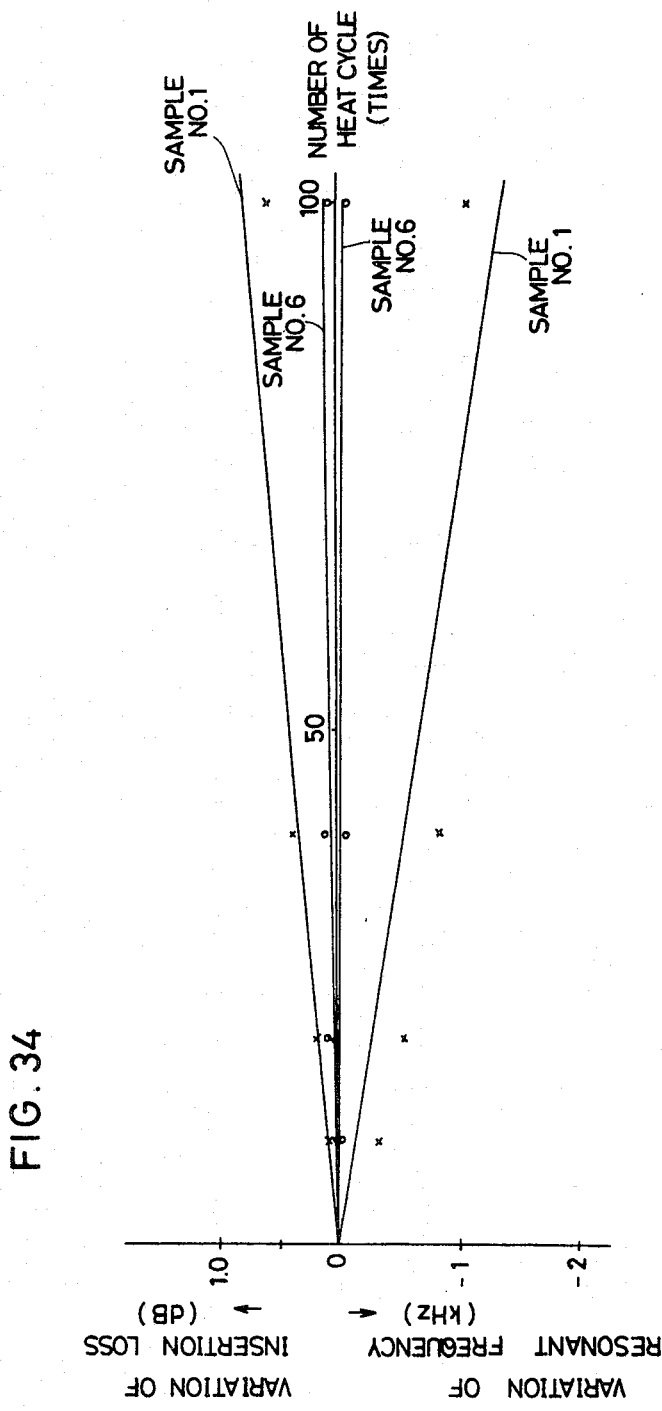
FIG. 34 is a graph showing the variation of the insertion loss and the resonance frequency of a tuning fork in accordance with one embodiment of the present invention and of a conventional tuning fork.

FIG. 35 shows another structure of the piezoelectric transducer, wherein the polarization direction of the ferroelectric ceramic plate 311 is parallel to the plane of the plate. In this case, the ceramic plate 311 comprises a rectangular plate 1.7 mm × 7 mm and of 0.2 mm thick, and the resistance value between the planes 331 and 332 perpendicular to the polarization direction is $5 \times 10^{-\Omega}$. The electrodes 312 and 313 serving as one of the conductive members are formed on the opposing main surfaces of the ceramic plate 311. Furthermore, the electrodes 333 and 334 serving as the conductive members are also formed on the side surfaces 331 and 332 of the ceramic plate 311 in accordance with a well-known process. With such structure, the conductive members on the side where the electric charges are stored due to the temperature change mainly comprises the electrodes 333 and 334 and not the electrodes 312 and 313. Accordingly, for the purpose of applying the present invention, the electrodes 333 and 334 are connected with the short-circuiting lead wire 335, as shown. The electrodes 333 and 334 may be electrically connected through a resistor. In such a case, the electrodes 333 and 334 may be formed of a material having a resistivity itself such as a resistive metal oxide. Alternatively, the electrodes 333 and 334 are not connected to each other but instead are electrically connected to the ground potential.

Thus, the present invention can be applied not only to a piezoelectric tuning fork as in the case of the above described embodiments but also to any type of mechanical filter wherein a piezoelectric transducer is combined with a mechanical resonator. In the following a typical mechanical filter will be described.

Figure 36:
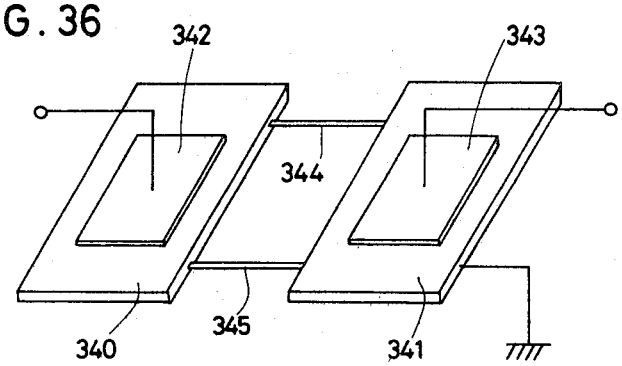
FIG. 36 is an outline perspective view of a tuning reed filter in accordance with one embodiment of the present invention.

FIG. 36 shows a tuning reed filter wherein the piezoelectric transducers 342 and 343 are fixed to the resonators 340 and 341 to cause a lateral vibration and which are coupled by means of twisted couplers 344 and 345.

Figure 37:
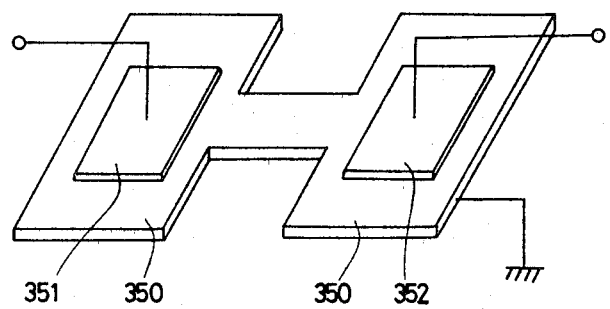
FIG. 37 is an outline perspective view of an H type filter in accordance with one embodiment of the present invention.

FIG. 37 shows a similar device wherein the piezoelectric transducers 351 and 352 are fixed to the H shaped resonator 350 to cause an expansion vibration.

Figure 38:
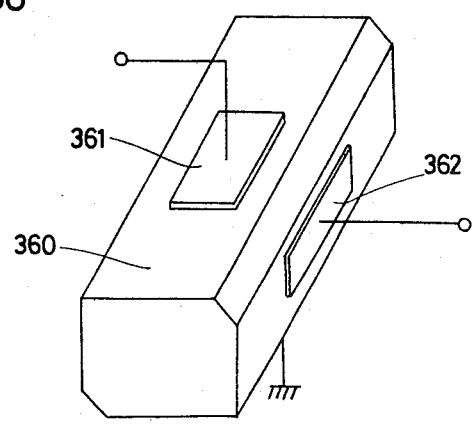
FIG. 38 is an outline perspective view of a multiple mode filter in accordance with one embodiment of the present invention.

FIG. 38 is one example of a mechanical filter utilizing a multiple vibration mode, wherein the piezoelectric transducers 361 and 362 are fixed to two adjacent side surfaces of a resonator 360 of an approximately square prism.

As a matter of course, the present invention is not limited to the above described structures and the present invention can be applied to any type of structures wherein a piezoelectric transducer is combined with a mechanical resonator.

Meanwhile, in the case where the polarization axis direction is oblique with respect to the plane of the plate, the embodiment in the case where the polarization axis direction is orthogonal to the plane of the plate and the embodiment in the case where the polarization axis direction is in parallel with the plane of the plate may be suitably combined depending upon the magnitude of the electric charge generated due to a temperature change.

Figure 39:
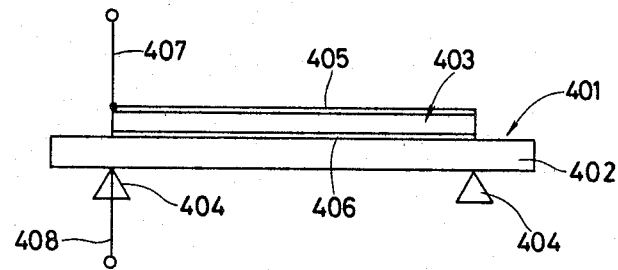
FIG. 39 is a view showing one example of a conventional two-terminal type piezoelectric buzzer wherein the present invention can be employed.

FIG. 39 shows a conventional piezoelectric buzzer which is an example of an electroacousic transducer using a piezoelectric transducer wherein the present invention can be practiced. Since the fundamental structure of such piezoelectric buzzer is well-known to those skilled in the art, only those portions associated with the present invention will be described in the following. The piezoelectric buzzer 401 for generating the vibration frequency of 3.160 kHz comprises a piezoelectric plate 403 of 25 mm in diameter and 0.23 mm in thickness fixed concentrically on one main surface of a metallic disc 402 of 35 mm in diameter and 0.48 mm in thickness, while the metallic disc 402 is supported on the other surface thereof by the support 404 at the position opposing to the vicinity of the peripheral edge of the piezoelectric plate 403. The piezoelectric plate 403 is made of a ferroelectric ceramic of the lead titanate zirconate group, for example, polarized in the thickness direction. The electrodes 405 and 406 of 25 mm in diameter for exciting the plate 403 thereat are formed facing each other on the piezoelectric ceramic plate 403. The electrodes 405 and 406 are connected to the respective withdrawing leads 407 and 408, respectively, by soldering.

FIGS. 40, 41, 42 and 43 are views showing piezoelectric buzzers of another embodiments of the present invention. Referring to these figures, the same portions as those in FIG. 39 are denoted by the same reference numerals and a detailed description thereof will be omitted. In these embodiments, as a composition of the piezoelectric plate 403, a ceramic of the titanate zirconate group of such as $(Pb_{0.95}Sr_{0.05})(Ti_{0.48}Zr_{0.52})O_3 + 0.75$ wt% $Nb_2O_5$ was employed as in the case of the FIG. 39 embodiment. In the case where such a ceramic was employed, the resistance value between the withdrawing leads 407 and 408 in a conventional state without embodying the present invention, i.e. the resistance value between the electrodes 405 and 406 was $3 \times 10^{10} 106$.

Figure 40:
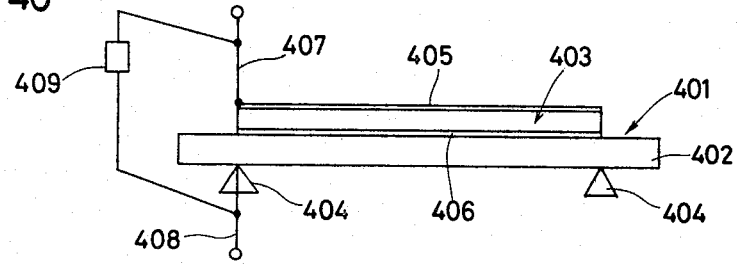
FIGS. 40 to 43 are views for showing different examples of a piezoelectric buzzer in accordance with another embodiment of the present invention.

In the FIG. 40 embodiment, a fixed resistor 409 was connected between the withdrawing leads 407 and 408. The resistance value thereof can be selected to be 1kΩ, 100kΩ, 10MΩ or 1000MΩ, for example, but the embodiment shown employed the resistor element of 100kΩ. The connection portion of the resistor 409 may be selected arbitrarily such as between the electrodes 405 and 406, between the withdrawing leads 407 and 408, and the like, insofar as the same is suited to the purpose of the present invention.

Figure 41:
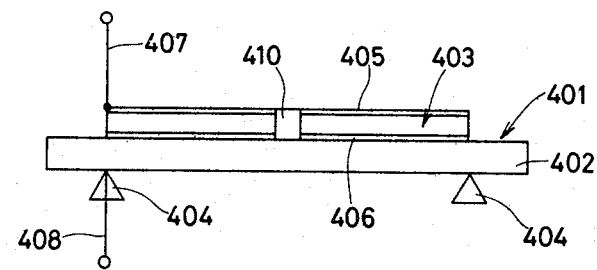

In the FIG. 41 embodiment, the resistive paste 410 was baked on the side surface and between both surfaces of the piezoelectric ceramic plate 403, whereby a given resistance value was established between the electrodes 405 and 406. As the resistive paste 410, one having carbon dispersed in phenol resin was employed and, although the resistance value may be selected to be 1kΩ, 100kΩ, 10MΩ or 1000MΩ, in the experiment the resistive paste 410 of 1kΩ and 10MΩ were baked. The resistive paste 410 is formed at the position 411 in FIG. 42, whereby the electrodes 405 and 406 are connected. In other words, the connection portion and the width of the paste may be arbitralily determined, insofar as the same are suited to the purpose of the present invention. Accordingly, a further structure for covering the peripheral surface with the resistive paste can also be considered, for example.

Figure 42:
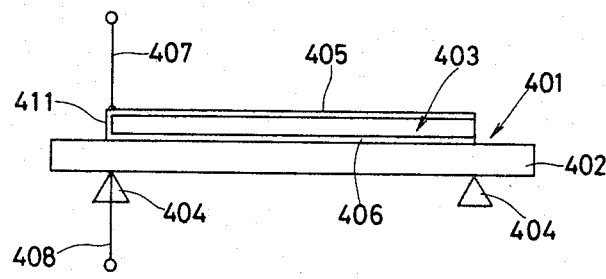
Figure 43:
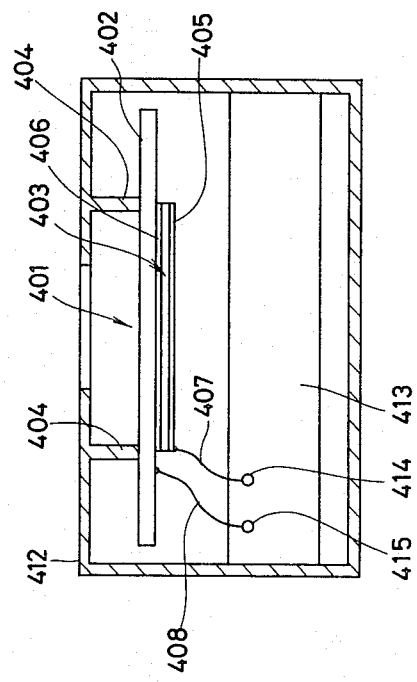

Although in the embodiments described in conjunction with FIGS. 40 and 41 and to be described in conjunction with FIG. 43 a silver electrode is used having a resistance value being approximately zero as electrodes in accordance with an evaporation process or a sputtering process, for example, in the FIG. 42 embodiment these electrodes are formed with resistive metal (such as tantalum or titanium) or resistive metal oxide (such as tin oxide) in accordance with an evaporation process or a sputtering process. In the embodiment shown, the silver pastes 411 having the resistance value being approximately zero are baked over both surfaces of the piezoelectric ceramic plate 403, whereby the electrodes 405 and 406 are directly connected without through a resistance. As a matter of course, the electrodes may be short-circuited by means of a lead wire, not shown, in place of the above described silver paste 411 and a connection portion thereof may be arbitrarily determined, insofar as the same is suited to the purpose of the present invention. Furthermore, the silver paste 411 or the short-circuiting lead wire may have a resistive component. It is required that the resultant resistance value of the electrodes and these silver paste 411 and the short-circuiting lead be selected smaller than the resistance value between the electrodes 405 and 406 of the piezoelectric ceramic plate 403 per se.

The FIG. 43 embodiment comprises a buzzer apparatus comprising a buzzer 401 and a driver circuit for the buzzer 401 both housed in a resonance case 412, wherein the present invention was employed. Predetermined terminals 414 and 415 of the plate 413 (illustration of the components is omitted) for incorporating the driver circuit are connected to the withdrawing leads 407 and 408, respectively. Accordingly, for the purpose of embodying the present invention, a resistive or semiconductive resin material was used for the case 412 and/or the plate 413. As a material for the case 412 and/or the plate 413, one having powder of carbon, metal, metal oxide, semiconductor oxide or powder of semiconductor glass dispersed in epoxy resin may be employed. Although the resistance value thereof may be selected to be 1kΩ, 100kΩ, 10MΩ and 1000MΩ, in the experiment the resistance value was selected to be 10MΩ and 1000MΩ. Furthermore, the case 412 and/or the plate 413 may be coated with a highly insulating and/or moistureproof resin material. The above described insulating resin material may be a conventional epoxy resin material. In the embodiment shown, it follows that the electrodes 405 and 406 are connected to each other by means of the above described resistive case 412 and/or plate 413 and accordingly the electrodes 405 and 406 are connected through a resistance value of the case 412 and/or the plate 413.

The piezoelectric buzzer 401 thus structured was then subjected to the heat shock test. The conditions of the heat shock test were selected as follows. More specifically, in one cycle the buzzer was maintained at −55° C. and +100° C. each for 60 minutes, wherein the temperature shift was made from −55° C. to +100° C., and such cycle was repeated 100 times or for 100 cycles. The temperature shift from −55° C. to +100° C. or the temperature shift in the reversed direction was made within few seconds.

The result of the heat shock test is shown in Table 6. Meanwhile, in the experimentation for Table 6, the embodiments shown in FIGS. 40, 41 and 43 were employed as sample Nos. 2 to 6 and the conventional one shown in FIG. 39 was employed as sample No. 1. In case of each of the embodiments, the point is that the electric charge generating electrodes may be connected across a resistance value smaller than the resistance value of the piezoelectric ceramic plate between the electric charge generating electrodes. In case of any of the embodiments, the heat shock test was conducted under the previously described conditions. The result is shown in Table 6.

Table 6 shows the result of measurement of the characteristic of the piezoelectric buzzer 401, i.e. the sound pressure as measured at a predetermined distance (10 cm) due to the heat shock test with respect to the number of test cycles. Measurement was made in such a state where the buzzer element 401 is housed in the resonance case 412.

As seen from Table 6, the conventional one shown in FIG. 39, i.e. the one without an inserted resistance value, exhibits the result that the more the number of cycles of the heat shock the smaller the sound pressure. By contrast, the FIG. 41 embodiment exhibits little change of the sound pressure, according to the data of the sample No. 2 standing for the example wherein the resistive paste 410 is selected to have a resistance of 1kΩ. Likewise, the FIG. 40 embodiment with the fixed resistive element 409 selected to be 100k is shown as sample No. 3. In the FIG. 43 embodiment, the example with the resistance value between the terminals 414 and 415 of the resistive plate 413 selected to be 10MΩ is shown as sample No. 4. The FIG. 41 embodiment with the resistance selected to be 10MΩ is shown as sample No. 5 and the FIG. 43 embodiment with the resistance value between the terminals 414 and 415 of the resistive plate 413 selected to be 1000MΩ is shown as sample No. 6. It will be appreciated that the change of the sound pressure of these sample Nos. 2 to 6 in Table 6 has been clearly and assuredly improved as compared with that of the conventional one shown in FIG. 39, i.e. sample No. 1.

Figure 44:
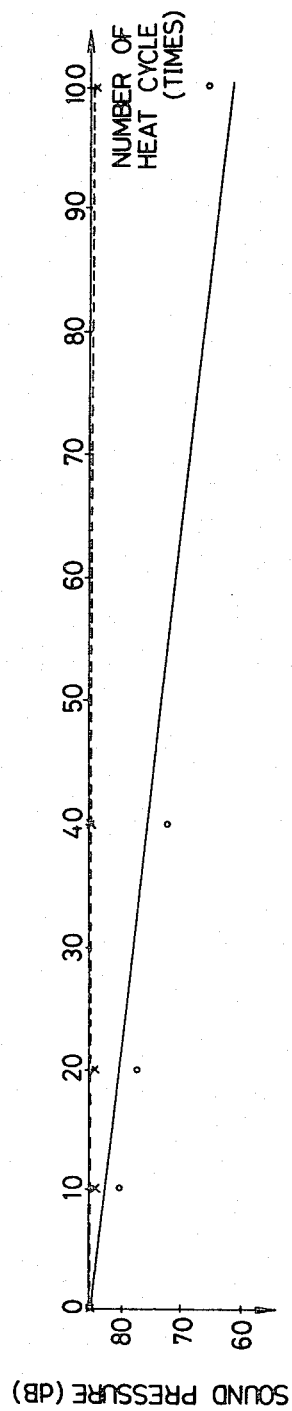
FIG. 44 is a graph showing sound pressure variation of a two-terminal type piezoelectric buzzer in accordance with one embodiment of the present invention and of a conventional two-terminal type piezoelectric buzzer.

FIG. 44 is a graph prepared based on the data shown in Table 6 and showing a change of the sound pressure between sample No. 6, i.e. the FIG. 43 embodiment with the resistance value between the terminals 414 and 415 of the resistive plate 413 selected to be 1000MΩ (shown by the dotted curve) and sample No. 1, i.e. the conventional one shown in FIG. 39 (shown by the solid curve).

It is important that the resistance value of the fixed resistor 409 in the FIG. 40 embodiment, the resistance value of the resistive paste 410 in the FIG. 41 embodiment, and the resistance value between the terminals 414 and 415 of the resistive plate 413 of the FIG. 43 embodiment are all selected to be smaller than the resistance value between the electrodes 405 and 406 of the piezoelectric ceramic plate 411. Furthermore, in the case of the FIG. 42 embodiment, it is important that the total sum of the resistance value of the respective electrodes 405 and 406 formed with the resistive paste and the resistance value of the silver paste 411 is selected to be smaller than the resistance value between the electrodes 405 and 406 of the piezoelectric ceramic plate 411. By evaluating the relation between the resistance value of the ceramic plate of various materials and the change of the electrical characteristic due to the heat shock test, it was discovered that as the resistance value of the ceramic plate becomes smaller than a predetermined value the change of the electric characteristic due to the heat shock test becomes smaller. The reason is presumed to be that the electric charge of the counterelectric field opposite to the direction of the electric field used for polarization is due to the pyroelectric effect is not stored on the electrodes opposed to each other on the ferroelectric ceramic plate but is quickly discharged through the internal path of the ceramic plate.

However, it has also been discovered that as the resistance of the ceramic plate decreases as described above the piezoelectric property decreases and diversification of the electric characteristic increases and accordingly it is required that another rapid discharge path be considered without decreasing the resistance value of the piezoelectric ceramic plate itself. In other words, this means that it would be better to discharge the electric charge through the external path without discharging the electric charge through the internal path of the ceramic plate and accordingly the electrodes wherein the electric charge is generated may be connected by a resistance smaller than the resistance value of the internal path of the ceramic plate, including a case of the resistance being zero. However, in case of a structure wherein the vibrating electrode plane intersects the polarization direction, it is required that the inherent operation of the piezoelectric transducer not be hindered and there is accordingly a limitation to the practical decrease of the resistance value. This lower limit value cannot be determined generally and must be determined on a case by case basis.

In the case of the heat shock test, when the temperature is shifted from the lower temperature ($-55°$ C.) to the high temperature ($+100°$ C.) an electric field is generated in the forward direction with respect to the polarization direction between the electrodes 405 and 406 on both sides of the plate 403 and when the temperature is shifted from the high temperature to the low temperature an electric field is generated in the reversed direction. It is presumed that the polarization of the plate 403 is lost due to this alternating electric field, whereby a decrease of the piezoelectric characteristic is caused. Therefore, in the above described embodiments, in order to decrease instantaneously such alternating electric field, the electrodes 405 and 406 on both surfaces intersecting the polarization direction of the plate 403 are electrically connected with a given resistance value.

Figure 45:
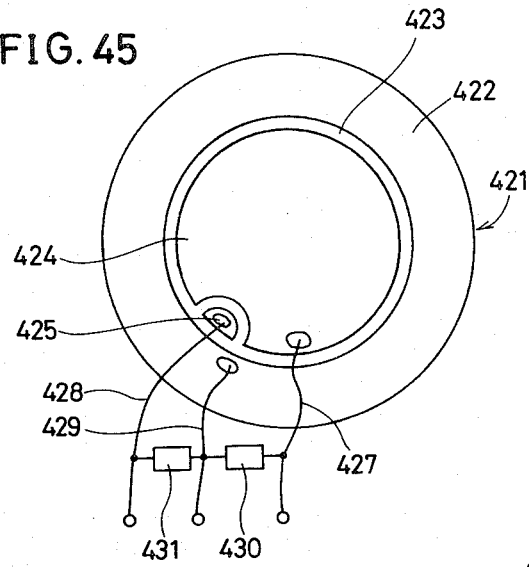
FIGS. 45 to 48 are views showing different examples of a three-terminal type piezoelectric buzzer in accordance with another embodiment of the present invention.

FIG. 45 shows one example of a three-terminal type piezoelectric buzzer in accordance with another embodiment of the present invention. Since such a piezoelectric buzzer 421 itself is well-known to those skilled in the art, only those portions associated with the present invention will be briefly described in the following. The piezoelectric buzzer 421 is adapted for the vibration frequency of 3.050 kHz and comprises a piezoelectric ceramic plate 423 of 25 mm in diameter and 0.23 mm in thickness adhered concentrically on one surface of a metallic disc 422 of 35 mm in diameter and 0.48 mm in thickness. The electrode 424 of an approximately circular shape with a portion notched and another electrode 425 being positioned at the above described notched portion are formed on one main surface of the piezoelectric plate 423. The whole surface electrode 426 is formed on the other surface of the piezoelectric plate 423. The withdrawing leads 427, 428 and 429 are connected to the electrodes 424 and 425 and the metallic disc 422, respectively, by soldering. In the FIG. 45 embodiment, fixed resistors 430 and 431 are connected between the withdrawing leads 427 and 429 and between the withdrawing leads 428 and 429, respectively.

Figure 46:
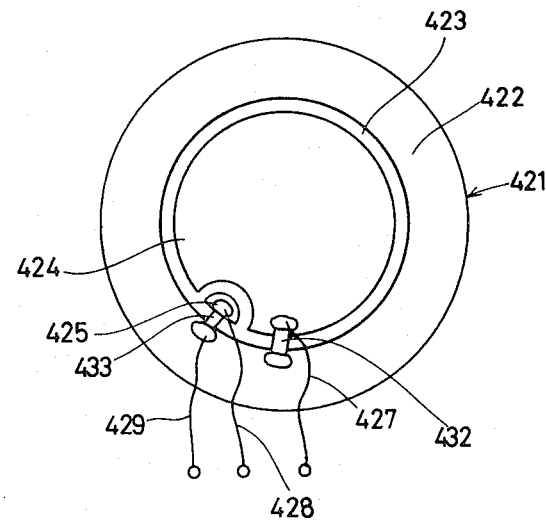
Figure 47:
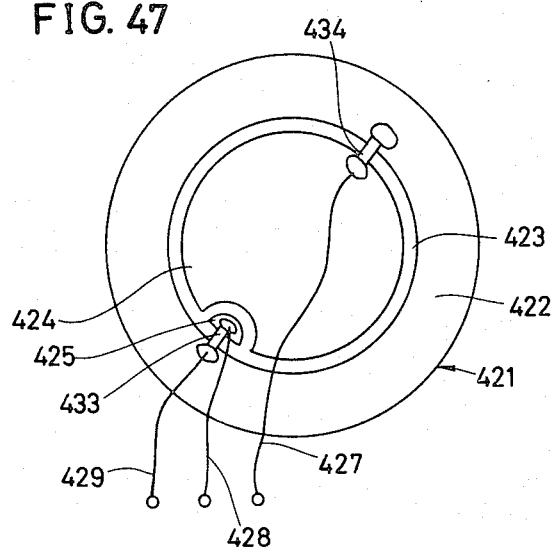
Figure 48:
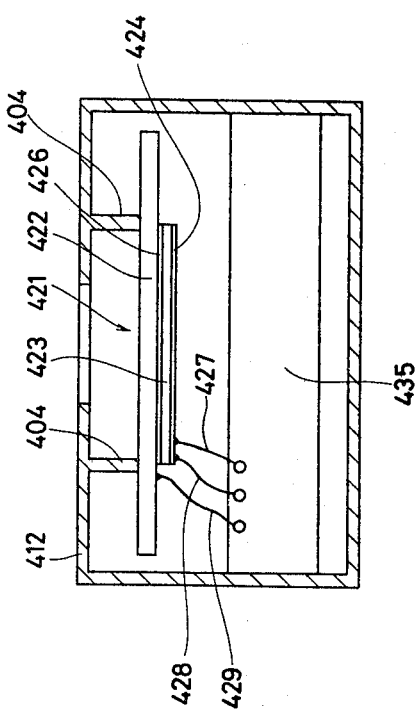

FIGS. 46, 47 and 48 show piezoelectric buzzers of another embodiment of the present invention.

In the FIG. 46 embodiment, the resistive paste 432 and 433 are formed over both surfaces of the plate 423, whereby the electrode 424 and the metallic disc 422 and thus the electrode 426, and the electrode 425 and the metallic disc 422 and thus the electrode 426 are electrically connected. Meanwhile, the resistive paste 432 is formed at the position 434 in FIG. 47, whereby the electrodes 424 and 426 are connected by the resistive paste 434. In other words, the connection portion may be arbitrarily determined, insofar as the same is suited to the purpose of present invention. Accordingly, alternatively an example may be considered where the resistive paste is formed to cover the peripheral side surface.

In the embodiment shown in FIGS. 46 and 47, the electrodes 424 and 426 may be formed not as a silver electrode in accordance with an evaporation process or a sputtering process but with resistive metal (such as tantalum and titanium) or metal oxide (such as tin oxide and the like) in accordance with an evaporation process or a sputtering process. The silver paste (the resistance value being approximately zero) 432 and 433 or 434 and 433 are formed over both surfaces of the plate 423, whereby the electrode 424 and the metallic discs 422 and 425 and the metallic disc 422 are directly connected. As a matter of course, the electrodes may be short-circuited by means of the lead wires, not shown, in place of the silver pastes 432 and 433 or 434 and 433. These connection portions may be selected arbitrarily, insofar as the same are suited for the purpose of the present invention. Furthermore, the silver pastes 432 and 433 or 434 and 433, and the short-circuiting lead wires may be of a resistive component.

In the FIG. 48 embodiment, as in the case of the FIG. 77 embodiment, the case 412 and/or the plate 435 are formed using a resistive or semiconductive resin material. Furthermore, the case 412 and/or the plate 435 may be covered with a highly insulating and/or moistureproof resin material. In the case of each of the embodiments, the electric charge generating electrodes need be connected with a resistance value smaller than the resistance value of the piezoelectric ceramic plate between the electric charge generating electrodes. In the case of each of the embodiments, the heat shock test was conducted under the previously described conditions. The result of the test is shown in Table 7.

Table 7 shows the result of measurement of the characteristic of the three-terminal type piezoelectric buzzer, i.e. the sound pressure, due to the heat shock test with respect to the number of test cycles. The measurement was made in such a state wherein the buzzer element is housed in the resonance case 412.

Sample No. 1 is the conventional device shown in FIG. 45 with the resistors 430 and 431 removed. Sample No. 2 is the FIG. 48 embodiment, with the resistance value selected to be 1kΩ. Sample No. 3 is the FIG. 46 embodiment, with the resistance values selected to be 100kΩ. The sample No. 4 is the FIG. 82 embodiment, with the resistance value selected to be 10MΩ. Sample No. 5 is the FIG. 45 embodiment, with the resistance value of the fixed resistive element selected to be 10MΩ. Sample No. 6 is the FIG. 46 embodiment, with the resistance value selected to be 1000MΩ.

As seen from Table 7, in the case where no shunt resistance is inserted at all, as conventionally, the greater the number of cycles the larger the change of the sound pressure. By contrast, as shown by samples Nos. 2 to 6, according to the present invention, an increase of the number of cycles does not entail so large a change of the sound pressure.

Figure 49:
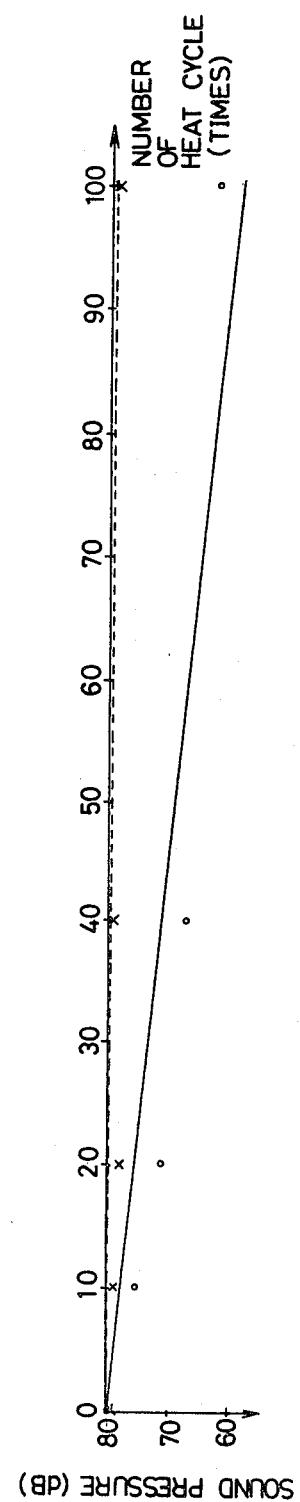
FIG. 49 is a graph showing variation of a sound pressure of a three-terminal type piezoelectric buzzer in accordance with another embodiment of the present invention and of a conventional three-terminal type piezoelectric buzzer.

FIG. 49 is the graph showing a change of the sound pressure with respect to the number of cycles, compairing sample No. 1 and sample No. 3. As seen from FIG. 50, the conventional device (solid curve) exhibits a large change of the sound pressure after being subjected to the heat shock test for 100 cycles. By contrast, the present invention (dotted curve) exhibits little change of the sound pressure even after being subjected to the heat shock test for 100 cycles.

In the foregoing, the examples employing the baked resistor, discrete fixed resistive elements and so on as the resistance were shown. Furthermore, the example employing the resin serving as the resistance was also shown. However, it is pointed out that according to the present invention semiconductor glass, paste, semiconductor oxide powder paste, semiconductor resin and so on may be used as the resistance, and the shunt resistance must be designed having regard to the circuitry in which it is to be used.

Furthermore, although in the above described embodiments the electrodes formed on both surfaces of the piezoelectric plate were electrically connected such that a resistance is substantially inserted therebetween, alternatively the respective electrodes may be electrically connected separately to the ground potential with a given resistance value, and a point is that the positive and negative electric charges generated due to the pyroelectric effect need be promptly decreased.

Although in the foregoing description there was shown the examples wherein the conductive members wherein the electric charge is stored are electrodes and the polarization axis direction is perpendicular to the plane of the piezoelectric ceramic plate where these electrodes are formed, further examples as described in the following may be considered.

Figure 50:
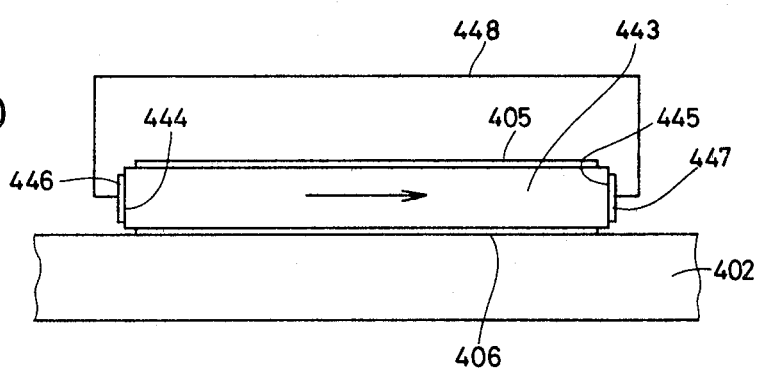
FIG. 50 is an outline side view of a piezoelectric transducer in accordance with another embodiment of the present invention.

FIG. 50 shows another structure of the electroacoustic transducer, wherein the polarization direction of the ferroelectric ceramic plate 443 is parallel to the plane of the plate. In such a case, the ceramic plate 443 comprises a disc 25 mm in diameter and 0.23 mm in thickness, and the resistance value between the surfaces vertical to the polarization direction, i.e. between the side surfaces 444 and 445, was $1 \times 10^{10}\Omega$. The electrodes 405 and 406 serving as one of the conductive members are formed on the opposing main surfaces of the ceramic plate 443. Furthermore, the electrodes 446 and 447 serving as the conductive members are also formed on the side surfaces 444 and 445 of the ceramic plate 443 in accordance with a conventionally well-known process. According to such structure, the conductive members where the electric charge due to a temperature change is stored mainly comprise the electrodes 446 and 447 and not the electrodes 405 and 406. Accordingly, for the purpose of applying the present invention, the electrodes 446 and 447 are connected by means of the short-circuiting lead wires 448, as shown, for example. The electrodes 446 and 447 may be electrically connected through a resistive component. In such a case, the electrodes 446 and 447 may be made of a material having a resistivity such as a resistive metal oxide material. Alternatively, the electrodes 446 and 447 may be electrically connected to the ground potential without being connected to each other.

It is pointed out that the present invention can be applied not only to a piezoelectric buzzer as in the above described embodiments but also to any type of electroacoustic transducer using a piezoelectric ceramic transducer. In the following, therefore, an application of the present invention to a typical electroacoustic transducer will be described.

Figure 51:
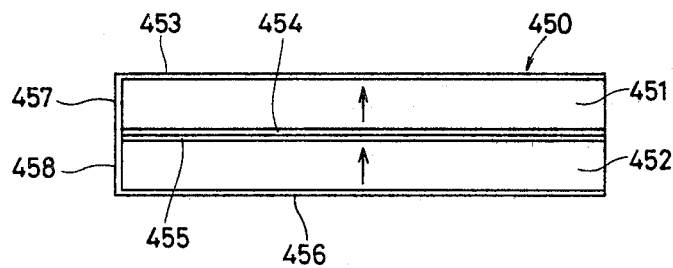
FIG. 51 is an outline side view of a bimorph vibrator in accordance with another embodiment of the present invention.

FIG. 51 shows a bimorph vibrator 450, which comprises two piezoelectric ceramic plates 451 and 452, wherein the electrodes 453 and 454 and the electrodes 455 and 456 formed on both main surfaces are connected by the resistive pastes 457 and 458, respectively. Of course, the previously described other embodiments may be employed.

Figure 52:
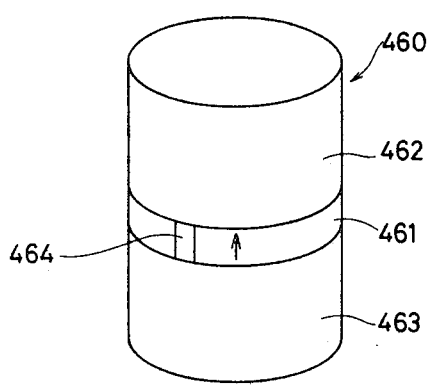
FIG. 52 is an outline perspective view of a Langevin type vibrator in accordance with another embodiment of the present invention.

FIG. 52 shows a Langevin type vibrator 460, wherein metallic posts 462 and 463 fixed to both main surfaces of the disc type piezoelectric ceramic plate 461 are connected by the resistive paste 464. Of course, the previously described other embodiments may also be employed. The Langevin type vibrator may be of a liquid-tight molded structure using rubber, resin or the like, and in such a case rubber, resin and the like may be preferably of a resistive component.

According to the present invention, point is that the electric charge caused due to the pyroelectric effect in the piezoelectric transducer used in an electroacoustic transformer is to be discharged and therefore the present invention can be naturally applied to any other types of electroacoustic transducer not mentioned in the specification.

In the case where the polarization axis direction is oblique with respect to the plane of the plate, the embodiment wherein the polarization axis direction is perpendicular to the plane of the plate and the embodiment wherein the polarization axis direction is in parallel with the plane of the plate may be suitably combined depending upon the magnitude of the electric charge generated due to a temperature change.

In the above described embodiment, in the case that the potential difference decreasing means comprises a grounding means, both the first and second members were connected to the ground potential portion. However, the grounding means may comprise only one of the first and second members (such as an interdigital electrode, a ground electrode, a vibrating electrode or the like) connected to the ground potential portion.

Although the present invention has been described and illustrated in detail, it is clearly understood that the embodiments described are by way of illustration and example only and are not to be taken by way of limitation, the spirit and scope of the present invention being limited only by the terms of the appended claims.

TABLE 1-continued

| Sample No. | Inserted Resistance Value | Number of Cycles | Insertion Loss X̄ (dB) | R(dB) | Center Frequency X̄ (MHz) | R(kHz) |
|---|---|---|---|---|---|---|
| 5 | | 50 | 20.6 | 0.2 | 44.108 | 37 |

TABLE 2

| Sample No. | Resistance Value of Adhesive Agent 3' | Resistance Value of Connection Material | Number of Cycles | Insertion Loss X̄ (dB) | R (dB) | Center Frequency X̄ (MHz) | R (kHz) |
|---|---|---|---|---|---|---|---|
| 1-1 | 1000 MΩ | None | 0 | 20.2 | 0.2 | 44.135 | 41 |
| 2 | | | 5 | 21.0 | 0.2 | 44.093 | 53 |
| 3 | | | 10 | 22.3 | 0.4 | 44.057 | 65 |
| 4 | | | 20 | 24.6 | 0.9 | 44.014 | 87 |
| 5 | | | 50 | 28.5 | 1.5 | 43.901 | 114 |
| 2-1 | 1 kΩ | Baked Resistor 1 Ω | 0 | 20.5 | 0.1 | 44.110 | 35 |
| 2 | | | 5 | 20.5 | 0.1 | 44.115 | 38 |
| 3 | | | 10 | 20.6 | 0.2 | 44.108 | 42 |
| 4 | | | 20 | 20.8 | 0.2 | 44.097 | 44 |
| 5 | | | 50 | 20.7 | 0.2 | 44.103 | 40 |
| 3-1 | 100 kΩ | Baked Resistor 100 kΩ | 0 | 20.4 | 0.1 | 44.119 | 40 |
| 2 | | | 5 | 20.6 | 0.2 | 44.108 | 37 |
| 3 | | | 10 | 20.6 | 0.2 | 44.111 | 35 |
| 4 | | | 20 | 20.7 | 0.2 | 44.102 | 42 |
| 5 | | | 50 | 20.8 | 0.2 | 44.110 | 41 |
| 4-1 | 10 MΩ | Baked Resistor 1000 MΩ | 0 | 20.3 | 0.1 | 44.126 | 29 |
| 2 | | | 5 | 20.3 | 0.1 | 44.127 | 33 |
| 3 | | | 10 | 20.4 | 0.2 | 44.127 | 31 |
| 4 | | | 20 | 20.4 | 0.1 | 44.124 | 38 |
| 5 | | | 50 | 20.4 | 0.2 | 44.122 | 36 |
| 5-1 | 10 MΩ | Fixed Resistor 10 MΩ | 0 | 20.1 | 0.1 | 44.141 | 43 |
| 2 | | | 5 | 20.3 | 0.1 | 44.133 | 40 |
| 3 | | | 10 | 20.3 | 0.2 | 44.130 | 37 |
| 4 | | | 20 | 20.5 | 0.2 | 44.125 | 36 |
| 5 | | | 50 | 20.7 | 0.2 | 44.114 | 39 |
| 6-1 | 1000 MΩ | Baked Silver 0 Ω | 0 | 20.2 | 0.1 | 44.132 | 33 |
| 2 | | | 5 | 20.5 | 0.2 | 44.123 | 35 |
| 3 | | | 10 | 20.4 | 0.2 | 44.127 | 39 |
| 4 | | | 20 | 20.4 | 0.1 | 44.128 | 31 |
| 5 | | | 50 | 20.5 | 0.2 | 44.120 | 36 |

TABLE 1

| Sample No. | Inserted Resistance Value | Number of Cycles | Insertion Loss X̄ (dB) | R(dB) | Center Frequency X̄ (MHz) | R(kHz) |
|---|---|---|---|---|---|---|
| 1-1 | None | 0 | 20.4 | 0.2 | 44.137 | 43 |
| 2 | | 5 | 21.1 | 0.2 | 44.110 | 48 |
| 3 | | 10 | 22.0 | 0.3 | 44.085 | 57 |
| 4 | | 20 | 23.5 | 0.5 | 44.028 | 71 |
| 5 | | 50 | 28.0 | 1.1 | 43.961 | 104 |
| 2-1 | Baked Resistor 1 kΩ | 0 | 20.7 | 0.2 | 44.097 | 40 |
| 2 | | 5 | 20.6 | 0.2 | 44.103 | 38 |
| 3 | | 10 | 20.6 | 0.2 | 44.105 | 35 |
| 4 | | 20 | 20.7 | 0.1 | 44.098 | 33 |
| 5 | | 50 | 20.8 | 0.2 | 44.090 | 36 |
| 3-1 | Baked Resistor 100 kΩ | 0 | 20.5 | 0.1 | 44.116 | 30 |
| 2 | | 5 | 20.5 | 0.2 | 44.110 | 37 |
| 3 | | 10 | 20.6 | 0.2 | 44.078 | 39 |
| 4 | | 20 | 20.6 | 0.2 | 44.083 | 40 |
| 5 | | 50 | 20.5 | 0.2 | 44.105 | 35 |
| 4-1 | Baked Resistor 10 MΩ | 0 | 20.8 | 0.2 | 44.103 | 28 |
| 2 | | 5 | 20.7 | 0.2 | 44.115 | 34 |
| 3 | | 10 | 20.7 | 0.2 | 44.119 | 30 |
| 4 | | 20 | 20.7 | 0.1 | 44.112 | 24 |
| 5 | | 50 | 20.7 | 0.1 | 44.109 | 26 |
| 5-1 | Fixed Resistor 10 MΩ | 0 | 20.3 | 0.2 | 44.128 | 40 |
| 2 | | 5 | 20.2 | 0.1 | 44.132 | 35 |
| 3 | | 10 | 20.4 | 0.1 | 44.120 | 39 |
| 4 | | 20 | 20.3 | 0.1 | 44.125 | 32 |
| 5 | | 50 | 20.3 | 0.1 | 44.126 | 33 |
| 6-1 | Baked Resistor 1000 MΩ | 0 | 20.6 | 0.1 | 44.124 | 26 |
| 2 | | 5 | 20.8 | 0.1 | 44.096 | 31 |
| 3 | | 10 | 20.7 | 0.2 | 44.105 | 34 |
| 4 | | 20 | 20.6 | 0.1 | 44.120 | 30 |

TABLE 3

| Sample No. | Insertion Manner and Resistance Value | Number of Cycles | Thickness Δf X̄ (kHz) | R (kHz) |
|---|---|---|---|---|
| 1-1 | None | 0 | 495 | 9 |
| 2 | (FIG. 35) | 10 | 484 | 15 |
| 3 | 20 | | 468 | 23 |
| 4 | | 40 | 447 | 36 |
| 5 | | 100 | 371 | 44 |
| 2-1 | Baked Resistor (FIG. 37) 1 kΩ | 0 | 502 | 5 |
| 2 | | 10 | 500 | 6 |
| 3 | | 20 | 495 | 6 |
| 4 | | 40 | 494 | 8 |
| 5 | | 100 | 491 | 10 |
| 3-1 | Fixed Resistor (FIG. 36) 100 kΩ | 0 | 510 | 8 |
| 2 | | 10 | 507 | 8 |
| 3 | | 20 | 504 | 9 |
| 4 | | 40 | 500 | 9 |
| 5 | | 100 | 498 | 11 |
| 4-1 | Resin Coated (FIG. 39) 10 MΩ | 0 | 505 | 10 |
| 2 | | 10 | 503 | 10 |
| 3 | | 20 | 500 | 9 |
| 4 | | 40 | 497 | 11 |
| 5 | | 100 | 495 | 12 |
| 5-1 | Baked Resistor (FIG. 37) 10 MΩ | 0 | 497 | 7 |
| 2 | | 10 | 496 | 8 |
| 3 | | 20 | 494 | 10 |
| 4 | | 40 | 491 | 10 |
| 5 | | 100 | 490 | 11 |
| 6-1 | Resin Coated (FIG. 39) 1000 MΩ | 0 | 503 | 6 |
| 2 | | 10 | 501 | 8 |
| 3 | | 20 | 499 | 9 |
| 4 | | 40 | 495 | 11 |

TABLE 3-continued

| Sample No. | Insertion Manner and Resistance Value | Number of Cycles | Thickness Δf X̄ (kHz) | R (kHz) |
|---|---|---|---|---|
| | 5 | 100 | 492 | 12 |

TABLE 4

| Sample No. | Insertion Manner and Resistance Value | Number of Cycles | Insertion loss X̄ (dB) | R(dB) | Center Frequency X̄ (MHz) | R(kHz) |
|---|---|---|---|---|---|---|
| 1-1 | None | 0 | 13.4 | 0.2 | 10.699 | 25 |
| 2 | | 10 | 14.1 | 0.5 | 10.680 | 30 |
| 3 | | 20 | 14.7 | 0.9 | 10.663 | 41 |
| 4 | | 40 | 16.2 | 1.3 | 10.627 | 68 |
| 5 | | 100 | 19.8 | 1.8 | 10.546 | 83 |
| 2-1 | Resin | 0 | 13.7 | 0.3 | 10.693 | 27 |
| 2 | Coated | 10 | 13.8 | 0.3 | 10.690 | 26 |
| 3 | 1 kΩ | 20 | 13.9 | 0.2 | 10.687 | 25 |
| 4 | | 40 | 13.9 | 0.3 | 10.687 | 26 |
| 5 | | 100 | 14.0 | 0.3 | 10.685 | 27 |
| 3-1 | Baked | 0 | 13.5 | 0.2 | 10.697 | 23 |
| 2 | Resistor | 10 | 13.5 | 0.2 | 10.696 | 24 |
| 3 | 100 kΩ | 20 | 13.6 | 0.3 | 10.694 | 26 |
| 4 | | 40 | 13.8 | 0.3 | 10.690 | 26 |
| 5 | | 100 | 13.8 | 0.3 | 10.691 | 26 |
| 4-1 | Resin | 0 | 13.3 | 0.1 | 10.704 | 18 |
| 2 | Coated | 10 | 13.4 | 0.1 | 10.700 | 20 |
| 3 | 10 MΩ | 20 | 13.6 | 0.2 | 10.695 | 23 |
| 4 | | 40 | 13.7 | 0.2 | 10.690 | 22 |
| 5 | | 100 | 13.9 | 0.2 | 10.688 | 25 |
| 5-1 | Fixed | 0 | 13.0 | 0.2 | 10.715 | 23 |
| 2 | Resistor | 10 | 13.2 | 0.2 | 10.707 | 24 |
| 3 | 10 MΩ | 20 | 13.5 | 0.3 | 10.699 | 25 |
| 4 | | 40 | 13.6 | 0.3 | 10.696 | 27 |
| 5 | | 100 | 13.7 | 0.3 | 10.692 | 26 |
| 6-1 | Baked | 0 | 13.2 | 0.2 | 10.708 | 22 |
| 2 | Resistor | 10 | 13.3 | 0.2 | 10.704 | 23 |
| 3 | 1000 MΩ | 20 | 13.5 | 0.3 | 10.700 | 26 |
| 4 | | 40 | 13.7 | 0.2 | 10.696 | 25 |
| 5 | | 100 | 13.8 | 0.2 | 10.690 | 25 |

TABLE 5

| Sample No. | Insertion Manner and Resistance Value | Number of Cycles | Tuning Fork Characteristic Loss(dB) X̄ | fr(kHz) X̄ |
|---|---|---|---|---|
| 1-1 | None | 0 | 8.5 | 900.02 |
| 2 | (FIG. 62) | 10 | 8.6 | 899.72 |
| 3 | | 20 | 8.7 | 899.51 |
| 4 | | 40 | 8.9 | 899.20 |
| 5 | | 100 | 9.1 | 898.97 |
| 2-1 | Baked | 0 | 8.5 | 900.53 |
| 2 | Resistor | 10 | 8.4 | 900.57 |
| 3 | (FIG. 65) | 20 | 8.5 | 900.55 |
| 4 | 1 kΩ | 40 | 8.5 | 900.54 |
| 5 | | 100 | 8.5 | 900.55 |
| 3-1 | Fixed | 0 | 8.5 | 900.24 |
| 2 | Resistor | 10 | 8.5 | 900.20 |
| 3 | (FIG. 64) | 20 | 8.5 | 900.25 |
| 4 | 100 kΩ | 40 | 8.5 | 900.23 |
| 5 | | 100 | 8.6 | 900.18 |
| 4-1 | Resistive | 0 | 8.4 | 899.95 |
| 2 | Resin Base | 10 | 8.4 | 899.97 |
| 3 | (FIG. 67) | 20 | 8.3 | 900.01 |
| 4 | 10 MΩ | 40 | 8.4 | 899.94 |
| 5 | | 100 | 8.4 | 899.93 |
| 5-1 | Baked | 0 | 8.5 | 901.02 |
| 2 | Resistor | 10 | 8.5 | 901.00 |
| 3 | (FIG. 65) | 20 | 8.4 | 901.06 |
| 4 | 10 MΩ | 40 | 8.4 | 901.07 |
| 5 | | 100 | 8.4 | 901.07 |
| 6-1 | Resistive | 0 | 8.4 | 900.71 |
| 2 | Resin Base | 10 | 8.4 | 900.70 |
| 3 | (FIG. 67) | 20 | 8.5 | 900.65 |

TABLE 5-continued

| Sample No. | Insertion Manner and Resistance Value | Number of Cycles | Tuning Fork Characteristic Loss(dB) X̄ | fr(kHz) X̄ |
|---|---|---|---|---|
| 4 | 1000 MΩ | 40 | 8.5 | 900.67 |
| 5 | | 100 | 8.4 | 900.69 |

TABLE 6

| Sample No. | Insertion Manner and Resistance Value | Number of Cycles | Buzzer Characteristic Sound Pressure (dB) |
|---|---|---|---|
| 1-1 | None | 0 | 85 |
| 2 | (FIG. 73) | 10 | 80 |
| 3 | | 20 | 77 |
| 4 | | 40 | 72 |
| 5 | | 100 | 65 |
| 2-1 | Baked | 0 | 87 |
| 2 | Resistor | 10 | 87 |
| 3 | (FIG. 75) | 20 | 86 |
| 4 | 1 kΩ | 40 | 86 |
| 5 | | 100 | 86 |
| 3-1 | Fixed | 0 | 84 |
| 2 | Resistor | 10 | 85 |
| 3 | (FIG. 74) | 20 | 85 |
| 4 | 100 kΩ | 40 | 85 |
| 5 | | 100 | 84 |
| 4-1 | Resistive | 0 | 86 |
| 2 | Plate 13 | 10 | 87 |
| 3 | (FIG. 77) | 20 | 86 |
| 4 | 10 MΩ | 40 | 86 |
| 5 | | 100 | 86 |
| 5-1 | Baked | 0 | 86 |
| 2 | Resistor | 10 | 85 |
| 3 | (FIG. 75) | 20 | 86 |
| 4 | 10 MΩ | 40 | 85 |
| 5 | | 100 | 85 |
| 6-1 | Resistive | 0 | 85 |
| 2 | Plate 13 | 10 | 84 |
| 3 | (FIG. 77) | 20 | 84 |
| 4 | 1000 MΩ | 40 | 85 |
| 5 | | 100 | 84 |

TABLE 7

| Sample No. | Insertion Manner and Resistance Value | Number of Cycles | Buzzer Characteristic Sound Pressure (dB) |
|---|---|---|---|
| 1-1 | None | 0 | 80 |
| 2 | | 10 | 75 |
| 3 | | 20 | 71 |
| 4 | | 40 | 67 |
| 5 | | 100 | 62 |
| 2-1 | Resistive | 0 | 81 |
| 2 | Plate 35 | 10 | 80 |
| 3 | 1 kΩ | 20 | 80 |
| 4 | | 40 | 81 |
| 5 | | 100 | 81 |
| 3-1 | Baked | 0 | 79 |
| 2 | Resistor | 10 | 79 |
| 3 | 100 kΩ | 20 | 78 |
| 4 | | 40 | 79 |
| 5 | | 100 | 79 |
| 4-1 | Resistive | 0 | 79 |
| 2 | Plate 35 | 10 | 79 |
| 3 | 10 MΩ | 20 | 79 |
| 4 | | 40 | 78 |
| 5 | | 100 | 78 |
| 5-1 | Fixed | 0 | 82 |
| 2 | Resistor | 10 | 81 |
| 3 | 10 MΩ | 20 | 81 |
| 4 | | 40 | 82 |
| 5 | | 100 | 81 |
| 6-1 | Baked | 0 | 81 |
| 2 | Resistor | 10 | 80 |
| 3 | 1000 MΩ | 20 | 80 |

TABLE 7-continued

| Sample No. | Insertion Manner and Resistance Value | Number of Cycles | Buzzer Characteristic Sound Pressure (dB) |
|---|---|---|---|
| 4 | | 40 | 80 |
| 5 | | 100 | 80 |

What is claimed is:

1. A piezoelectric device, comprising:

a ferroelectric plate which is polarized in a polarization axis direction and which has first and second opposing surfaces intersecting said polarization axis direction;

first and second bulk wave electrodes formed on said first and second surfaces of said ferroelectric plate, respectively, said first and second electrodes cooperating with each other and with said ferroelectric plate to define a bulk wave piezoelectric component; and first and second withdrawing means connected to said first and second bulk wave electrodes, respectively;

a resistive resin material covering at least part of said ferroelectric plate and being in electrical contact with said first and second withdrawing means such that said resin material shunts an electric charge produced by the pyroelectric effect on said two surfaces of said ferroelectric plate, said resin material having a resistance of between 1k and 1000M ohms, the resistance value of said resistive resin material being selected to be smaller than the inherent resistance of said ferroelectric plate in said polarization axis direction.

2. A piezoelectric device in accordance with claim 1, wherein said resin material forms a resin layer covering substantially all of said ferroelectric plate and at least a portion of each of said electrodes.

3. A piezoelectric device in accordance with claim 2, further comprising an insulating resin layer having an excellent anti-humidity characteristic and covering said resistive resin layer.

4. A piezoelectric device in accordance with claim 1, wherein:

one of said first and second bulk wave electrodes is a ground electrode; and said first withdrawing means includes a first withdrawing electrode electrically connected to said first bulk wave electrode and a first withdrawing terminal connected to said first withdrawing electrode; and said second withdrawing means includes a second withdrawing electrode electrically connected to said second bulk wave electrode and a second withdrawing terminal electrically connected to said second withdrawing electrode such that when said ground electrode is connected to ground an electric charge caused by the pyroelectric effect and stored in said first and second bulk wave electrodes will be discharged to a ground potential through said resistive resin layer and said withdrawing terminals.

5. A piezoelectric device in accordance with any one of claims 1, 2, 3 or 4, wherein said bulk wave piezoelectric component includes additional electrode means not directly contributing to generation of bulk waves in said ferroelectric plate.

6. A piezoelectric device, comprising:

(A) a bulk wave piezoelectric element including:
(1) a ferroelectric plate which is polarized in a polarization axis direction and which has first and second opposing surfaces intersecting said polarization axis direction;
(2) first and second electrode formed on said first and second surfaces, respectively, said first and second electrodes cooperating with each other and with said ferroelectric plate to define a bulk wave piezoelectric component;
(3) first and second withdrawing terminals connected to said first and second electrodes, respectively; and
(4) a resin layer covering a portion of said withdrawing terminals and said ferroelectric plate;

(B) a metallic case receiving said bulk wave piezoelectric element; and (C) a filler material comprising a resistive material filling areas between said metallic case and said bulk wave piezoelectric element and electrically connecting said withdrawing terinals in such a manner that an electric charge stored in said first and second electrodes due to the pyroelectric effect will be discharged through said withdrawing terminals and said filler material.

7. A piezoelectric device in accordance with claim 6, wherein the resistance value of said filler material is selected to be smaller than the inherent resistance of said ferroelectric plate in said polarization axis direction.

8. A piezoelectric device, comprising:

a ferroelectric plate which is polarized in a polarization axis direction and which has first and second opposing main electrodes which lie parallel to said polarization axis direction and which also has first and second opposing side surfaces interconnecting said polarization axis direction;

first and second electrodes formed on said first and second main surfaces, respectively, and cooperating with each other and with said ferroelectric plate to define a bulk wave piezoelectric component;

third and fourth electrodes in electrical contact with said first and second side surfaces and not directly contributing to generation of bulk waves in said ferroelectric plate; and connecting means formed on said plate for electrically connecting said third and fourth electrodes to a ground potential whereby electric charge due to the pyroelectric effect flows to said ground potential.

9. A piezoelectric device, comprising:

a ferroelectric plate which is polarized in a polarization axis direction and which has first and second opposing main electrodes which lie parallel to said polarization axis direction and which also has first and second opposing side surfaces interconnecting said polarization axis direction;

first and second electrodes formed on said first and second main surfaces, respectively, and cooperating with each other and with said ferroelectric plate to define a bulk wave piezoelectric component;

third and fourth electrodes in electrical contact with said first and second side surface and not directly contributing to generation of bulk waves in said ferroelectric plate, at least one of said third and fourth electrodes being formed of a resistive material; and connecting means for electrically connecting said third and fourth electrodes to one another, whereby electric charge stored in said third and fourth electrodes due to the pyroelectric effect is shunted through said connecting means.

10. A piezoelectric device, comprising:

a ferroelectric plate which is polarized in a polarization axis direction and which has first and second opposing surfaces intersecting said polarization axis direction;

first and second electrodes formed on said first and second surfaces, respectively, said first and second electrodes cooperating with each other and with said ferroelectric plate to define a bulk wave piezoelectric component;

at least one of said electrodes being formed of a resistive material; and connecting means for connecting said first and second electrodes such that an electric charge due to the pyroelectric effect is shunted through resistive material and said connecting means.

11. A piezoelectric device in accordance with claim 9, wherein the resistance of the electrode of a portion where said electric charge flows is smaller than the inherent resistance of said ferroelectric plate in said polarization axis direction.

12. A piezoelectric device, comprising:

a ferroelectric plate which is polarized in a polarization axis direction and has first and second opposing surfaces which intersect said polarization axis direction; and first and second electrodes formed on said first and second surfaces, respectively, said first and second electrodes cooperating with each other and with said ferroelectric plate to define a piezoelectric sound generating element;

a metallic plate attached to said first electrode, said metallic plate being vibrated by said piezoelectric sound generating element when said element is electrically driven;

a casing for housing said metallic plate; and a base plate housed in said casing and having a circuit for driving said piezoelectric sound generating element mounted thereon; said first and second electrodes being electrically connected to one of said base plate and said casing, said one of said casing and said base plate being formed of a resistive material such that an electric charge stored on said first and second electrodes by the pyroelectric effect flows through at least one of said resistive casing and said resistive base plate.

13. A piezoelectric device, comprising:

a ferroelectric plate which is polarized in a polarization axis direction and which has first and second opposing surfaces intersecting said polarization axis direction;

first and second electrodes formed on said first and second surfaces, respectively, said first and second electrodes cooperating with each other and with said ferroelectric plate to define a piezoelectric transducer element;

a mechanical vibrating member attached to said first electrode, said mechanical vibrating member being vibrated by said piezoelectric transducer element when said element is electrically driven;

first and second terminals connected to said first and second electrodes, respectively; and a base plate supporting said mechanical vibrating member and having said first and second terminals mounted thereon, said base plate being formed of a resistive material such that an electric charge stored on said first and second electrodes by the pyroelectric effect flows through at least a portion of said resistive base plate.

* * * * *